(12) United States Patent
Kong et al.

(10) Patent No.: US 8,694,858 B2
(45) Date of Patent: Apr. 8, 2014

(54) MEMORY CONTROLLER AND OPERATING METHOD OF MEMORY CONTROLLER

(75) Inventors: JaePhil Kong, Seoul (KR); Yongwon Cho, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/467,497

(22) Filed: May 9, 2012

(65) Prior Publication Data

US 2012/0290901 A1  Nov. 15, 2012

(30) Foreign Application Priority Data

May 9, 2011 (KR) ........................ 10-2011-0043619

(51) Int. Cl.
*G06F 11/00* (2006.01)
*G11C 29/00* (2006.01)

(52) U.S. Cl.
USPC .......................................... 714/763; 714/704

(58) Field of Classification Search
None
See application file for complete search history.

(56) References Cited

U.S. PATENT DOCUMENTS

| | | | | |
|---|---|---|---|---|
| 6,263,470 | B1 * | 7/2001 | Hung et al. | 714/784 |
| 7,206,992 | B2 * | 4/2007 | Xin | 714/782 |
| 7,237,183 | B2 * | 6/2007 | Xin | 714/782 |
| 2004/0177312 | A1 * | 9/2004 | Xin | 714/782 |
| 2004/0181735 | A1 * | 9/2004 | Xin | 714/758 |
| 2009/0063934 | A1 | 3/2009 | Jo | |
| 2009/0217140 | A1 | 8/2009 | Jo et al. | |
| 2010/0011247 | A1 * | 1/2010 | Shrader et al. | 714/25 |
| 2010/0131831 | A1 * | 5/2010 | Weingarten et al. | 714/782 |
| 2010/0241932 | A1 * | 9/2010 | Sakaue et al. | 714/784 |
| 2011/0197110 | A1 * | 8/2011 | Kanno et al. | 714/773 |
| 2012/0137152 | A1 * | 5/2012 | Dror et al. | 713/322 |
| 2012/0233521 | A1 * | 9/2012 | Kwok et al. | 714/758 |
| 2012/0246526 | A1 * | 9/2012 | Dror | 714/704 |

FOREIGN PATENT DOCUMENTS

| | | |
|---|---|---|
| JP | 06-152436 | 5/1994 |
| KR | 10-2000-0067136 | 11/2000 |
| KR | 10-2009-0021743 | 3/2009 |
| KR | 10-2009-0092628 | 9/2009 |

OTHER PUBLICATIONS

Low power decoding of BCH codes Yuejian Wu Circuits and Systems, 2004. ISCAS '04. Proceedings of the Yuejian Wu, Low power decoding of BCH codes, Publication Year: 2004, pp. II-369-II-372.*

* cited by examiner

*Primary Examiner* — Guerrier Merant
(74) *Attorney, Agent, or Firm* — Stanzione & Kim, LLP

(57) ABSTRACT

A controller to control a memory system including a memory device. The controlling the memory system may include calculating an error location polynomial in a received read vector with a key equation solving unit of the memory system to read data from the memory device, estimating the number of errors in the received read vector with a control unit of the memory system according to at least one of the calculated error location polynomial and information on the error location polynomial, searching error locations of the received read vector according to the calculated error location polynomial with a chien search unit of the memory system with the control unit. A cycle-per power consumption of the chien search unit may be adjusted with the control unit. A maximum correction time may be adjusted according to the number of errors of the read vector.

34 Claims, 21 Drawing Sheets

MEMORY CONTROLLER AND OPERATING METHOD OF MEMORY CONTROLLER

CROSS-REFERENCE TO RELATED APPLICATIONS

This application claims the priority under 35 U.S.C §119 from Korean Patent Application No. 10-2011-0043619, filed May 9, 2011 in the Korean Intellectual Property Office, the disclosure of which is incorporated by reference herein in its entirety.

BACKGROUND OF THE INVENTION

1. Field of the Invention

Exemplary embodiments of the present general inventive concept relate to a memory controller and an operating method thereof.

A semiconductor memory device may be a memory device which is fabricated using semiconductors such as silicon (Si), germanium (Ge), gallium arsenide (GaAs), indium phosphide (InP), and the like. Semiconductor memory devices may be classified into volatile memory devices and nonvolatile memory devices.

2. Description of the Related Art

The volatile memory devices may lose stored contents at power-off. The volatile memory devices include a static random access memory (SRAM), a dynamic random access memory (DRAM), a synchronous dynamic random access memory (SDRAM), and the like. The nonvolatile memory devices may retain stored contents even at power-off. The nonvolatile memory devices may include a read only memory (ROM), a programmable ROM (PROM), an electrically programmable ROM (EPROM), an electrically erasable and programmable ROM (EEPROM), a flash memory device, a phase-change random access memory (PRAM), a magnetic random access memory (MRAM), a resistive random access memory (RRAM), a ferroelectric random access memory (FRAM), and the like. The flash memory device may be divided into a NOR type and a NAND type.

An increase in a storage capacity of a semiconductor memory device may be accomplished by improving the integrity of the semiconductor memory device and by programming multi-bit data in one memory cell. Improvement of the integrity of the semiconductor memory device may be accomplished by refining the processes of the semiconductor memory device. Programming of multi-bit data in one memory cell may be accomplished by reducing a distribution of a logic value stored in a memory cell. A memory cell storing multi-bit data may be called a multi-level cell (MLC).

The improved integrity and the introduction of MCL may cause an increase in an error rate. As the integrity is improved, data stored in a memory cell may be easily affected by noise. With an increase in an error rate, an error correcting function included in a memory controller may be expanded. This may cause an increase in power consumption.

SUMMARY OF THE INVENTION

Exemplary embodiments of the present general inventive concept may provide a memory system, a computing system, and methods of controlling the memory and computing systems so as to adjust the cycle-per-power consumption of a chien search unit that searches error locations in a read vector output from a memory device. The power consumption may be adjusted by adjusting the number of bits of the read vector to be searched at the same time by the chien search unit. As the number of errors in a read vector increases, the cycle-per-power consumption of the chien search unit may be reduced.

Exemplary embodiments of the present general inventive concept may also provide a memory system, a computing system, and methods of controlling the memory and computing systems so as to adjust a maximum correction time of a chien search unit that searches error locations in a read vector output from a memory device. The maximum time may be increased according to whether the chien search is performed on the data portions and/or parity portions of the read vector, as well as an operation mode of the chien search unit.

Additional features and utilities of the present general inventive concept will be set forth in part in the description which follows and, in part, will be obvious from the description, or may be learned by practice of the general inventive concept.

Exemplary embodiments of the present general inventive concept may also provide a controller of a memory system to control a memory device, including a key equation solving unit to calculate an error location polynomial in a read vector received by the controller to read data from the memory device, a control unit to estimate the number of errors in the received read vector according to at least one of the calculated error location polynomial and information on the error location polynomial, and a chien search unit to search error locations of the received read vector according to the calculated error location polynomial.

The controller may include an error correcting unit to correct errors of the received read vector at the error locations determined by the chien search unit using the error location polynomial calculated by the key equation solving unit.

The control unit may adjust the cycle-per power consumption of the chien search unit.

The control unit may adjust the cycle-per power consumption of the chien search unit by adjusting the number of bits to be searched at the same time in the received read vector according to the error location polynomial calculated by the key equation solving unit.

The control unit may control the chien search unit to operate in a full search mode to simultaneously search the bits of at least a data portion of the received read vector when the number of errors is less than or equal to a predetermined first error number.

The control unit may control the chien search unit to operate in a half search mode to simultaneously search half of the number of bits of the received read vector as a full search mode at the same time when the number of errors is greater than the predetermined first error number and less than a predetermined second error number.

The cycle-per-power consumption of the chien search unit operating in the half search mode may be less than that of the full search mode.

The control unit may control the chien search unit to operate in a quarter search mode to simultaneously search one quarter of the number of bits of the received read vector at the same time as the full search mode when the number of errors is greater than the predetermined second error number.

The cycle-per-power consumption of the chien search unit operating in the quarter search mode may be less than that of the half search mode.

The control unit may control the chien search unit to perform a chien search on only a data portion of the received read vector when the number of errors is less than or equal to a predetermined threshold value.

The control unit may control the chien search unit to perform a chien search on a data portion and a parity portion of the received read vector when the number of detected errors is greater than a predetermined threshold value.

The control unit may adjust a maximum correction time of the chien search unit according to the number of errors of the read vector.

The control unit may adjust the maximum correction time of the chien search unit to a first predetermined solving time when the number of errors is less than a first predetermined error number.

When the number of errors is less than the first predetermined error number, the control unit may control the chien search unit to operate in a full search mode to simultaneously search the bits of at least a data portion of the read vector.

When the number of errors is greater than the first predetermined error number and less than a second predetermined error number, the control unit may control the chien search unit to operate in a half search mode to simultaneously search half the number of the bits of at least a data portion of the read vector as when operating in a full search mode.

When the number of errors is greater than a second predetermined error number, the control unit may control the chien search unit to operate in a quarter search mode to simultaneously search one quarter the number of the bits of at least a data portion of the read vector as when operating in a full search mode.

The control unit may adjust the maximum correction time of the chien search unit to perform the chien search on a data portion and a parity portion of the received read vector when the number of detected errors is greater than a predetermined threshold value.

Exemplary embodiments of the present general inventive concept may also provide a method of controlling a memory system including a memory device, the method including calculating an error location polynomial in a received read vector with a key equation solving unit of the memory system to read data from the memory device, estimating the number of errors in the received read vector with a control unit of the memory system according to at least one of the calculated error location polynomial and information on the error location polynomial, and searching error locations of the received read vector according to the calculated error location polynomial with a chien search unit of the memory system with the control unit.

The method may including correcting errors of the received read vector with an error correcting unit at the error locations determined by the chien search unit using the error location polynomial calculated by the key equation solving unit.

The method may include adjusting the cycle-per power consumption of the chien search unit with the control unit.

Adjusting the cycle-per power consumption of the chien search unit in the method may include adjusting the number of bits to be searched at the same time in the received read vector with the control unit according to the error location polynomial calculated by the key equation solving unit.

The method may include operating the chien search unit in a full search mode to simultaneously search the bits of at least a data portion of the received read vector when the number of errors is less than or equal to a predetermined first error number.

The method may include operating the chien search unit in a half search mode to simultaneously search half of the number of bits of the received read vector as a full search mode at the same time when the number of errors is greater than the predetermined first error number and less than a predetermined second error number.

The method may include where the cycle-per-power consumption of the chien search unit operating in the half search mode is less than that of the full search mode.

The method may include operating the chien search unit in a quarter search mode to simultaneously search one quarter of the number of bits of the received read vector at the same time as the full search mode when the number of errors is greater than the predetermined second error number.

The method may include where the cycle-per-power consumption of the chien search unit operating in the quarter search mode is less than that of the half search mode.

The method may further include controlling the chien search unit with the control unit to perform a chien search on only a data portion of the received read vector when the number of errors is less than or equal to a predetermined threshold value.

The method may include controlling the chien search unit with the control unit to perform a chien search on a data portion and a parity portion of the received read vector when the number of detected errors is greater than a predetermined threshold value.

The method may include adjusting a maximum correction time of the chien search unit with the control unit according to the number of errors of the read vector.

The method may include adjusting the maximum correction time of the chien search unit with the control unit to a first predetermined solving time when the number of errors is less than a first predetermined error number.

The method may include that when the number of errors is less than the first predetermined error number, operating the chien search unit in a full search mode to simultaneously search the bits of at least a data portion of the read vector.

The method may include that when the number of errors is greater than the first predetermined error number and less than a second predetermined error number, operating the chien search unit in a half search mode to simultaneously search half the number of the bits of at least a data portion of the read vector as when operating in a full search mode.

The method may include that when the number of errors is greater than a second predetermined error number, operating the chien search unit in a quarter search mode to simultaneously search one quarter the number of the bits of at least a data portion of the read vector as when operating in a full search mode.

The method may include adjusting the maximum correction time of the chien search unit with the control unit to perform the chien search on a data portion and a parity portion of the received read vector when the number of detected errors is greater than a predetermined threshold value.

Exemplary embodiments of the present general inventive concept may also provide a method of controlling a memory system having a controller coupled via at least one channel to at least one memory device, the method including determining an estimated number of errors and error location information of a read vector received by the controller to read data from the at least one memory device via the at least one channel, and adjusting at least one of a cycle-per-power consumption and a maximum correction time of a chien search unit of the memory system that searches error locations of the read vector according to the estimated number of errors and the determined error location information.

Exemplary embodiments of the present general inventive concept may also provide a controller of a memory system having at least one memory device coupled to the controller via at least one channel, including an error correction code decoder of the controller to determine an estimated number of errors and error location information of a read vector received by the controller to read data from the at least one memory device via the at least one channel, and a control unit of the error correction code decoder to adjust at least one of a cycle-per-power consumption and a maximum correction time of a chien search unit of the memory system that searches error locations of the read vector according to the estimated number of errors and the determined error location information.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
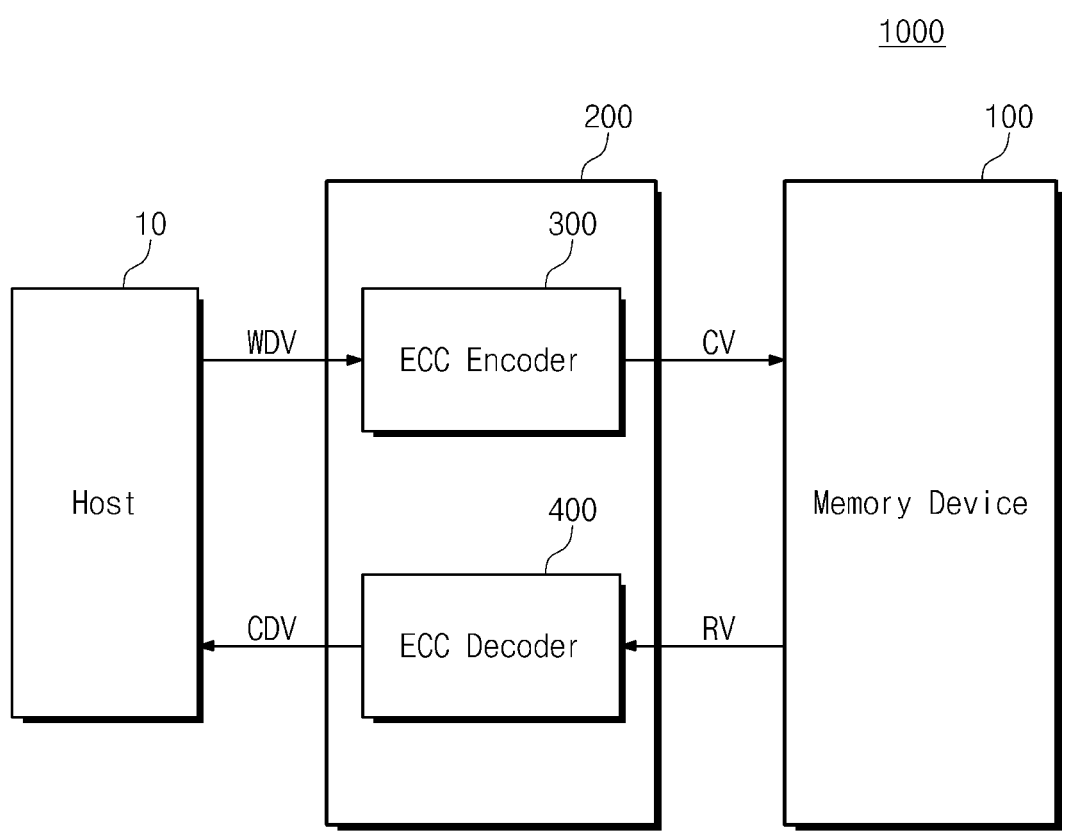
FIG. 1 is a block diagram illustrating a memory system according to exemplary embodiments of the present general inventive concept.

The present general inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a memory system according to exemplary embodiments of the present general inventive concept. Referring to FIG. 1, a memory system 1000 may include a memory device 100 and a controller 200.

The memory device 100 may operate according to the control of the controller 200. The memory device 100 may store a code vector CV input from the controller 200. The memory device 100 may read a stored vector to output it to the controller 200 as a read vector RV. The memory device 100 may be configured to delete a stored vector. The memory device 100 may include a volatile memory device such as an SRAM, a DRAM, an SDRAM, etc. or a nonvolatile memory device such as a ROM, a PROM, an EPROM, an EEPROM, a flash memory, a PRAM, an MRAM, an RRAM, a FRAM, etc.

The controller 200 may be coupled with the memory device 100. That is, the controller 200 may be coupled via a wireless and/or wired communications link to the memory device 100. The controller 200 may access the memory device 100 in response to a request from a host 10. The host 10 may be communicatively coupled to the controller 200, and may include a processor, a computer, a programmable logic device, a field programmable gate array, and integrated circuit, a portable media player, a set-top box, a server, a cell phone, a personal digital device, and/or any other suitable host to carry out the exemplary embodiments of the present general inventive concept. The controller 200 may include an ECC encoder 300 and an ECC decoder 400.

The ECC encoder 300 may receive a write data vector WDV from the host 10 and may encode the input write data vector WDV to a code vector CV. The code vector CV may be sent to the memory device 100. The ECC decoder 400 may receive the read vector RV from the memory device 100. The ECC decoder 400 may correct an error of the read vector RV. The ECC decoder 400 may extract an error-corrected data vector CDV from an error-corrected read vector to send the extracted error-corrected data vector CDV to the host 10.

The controller 200 may communicate with the host 10 according to various communication protocols. For example, the controller 200 may communicate with the host 10 according to at least one of various communication protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, an IDE (Integrated Drive Electronics) protocol, and a FireWire.

The controller 200 and the memory device 100 may be integrated in a single semiconductor device. The controller 200 and the memory device 100 may be integrated in a single semiconductor device to form a solid state drive (SSD). The controller 200 and the memory device 100 may be integrated in a single semiconductor device to form a memory card. For example, the controller 200 and the memory device 100 may be integrated in a single semiconductor device to form a memory card such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, or the like.

In exemplary embodiments of the present general inventive concept, the memory system 1000 may be used as and/or be communicatively coupled to computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID (radio frequency identification), or one of various electronic devices that may be a computing system.

In exemplary embodiments of the present general inventive concept, a memory device 100 or a memory system 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 2:
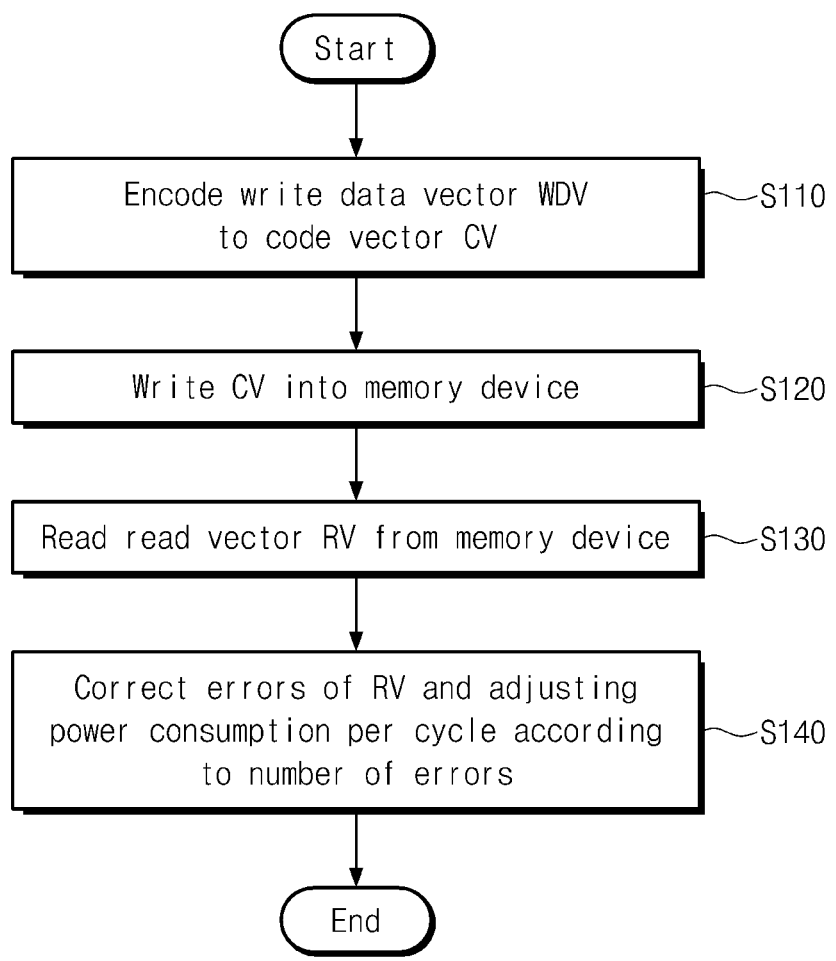
FIG. 2 is a flowchart illustrating an operating method of a controller in FIG. 1 according to exemplary embodiments of the present general inventive concept.

FIG. 2 is a flowchart illustrating an operating method of a controller in FIG. 1 according to exemplary embodiments of the present general inventive concept. Referring to FIGS. 1 and 2, in operation S110, an ECC encoder 300 may encode a write data vector WDV to a code vector CV. In operation S120, the code vector CV may be written in a memory device 100.

In operation S130, a read vector RV may be read from the memory device 100. In operation S140, an ECC decoder 400 may adjust cycle-per-power consumption according to the number of errors of the read vector RV and may correct errors of the read vector RV. Below, the operations S110 and S140 will be more fully described sequentially.

Figure 3:
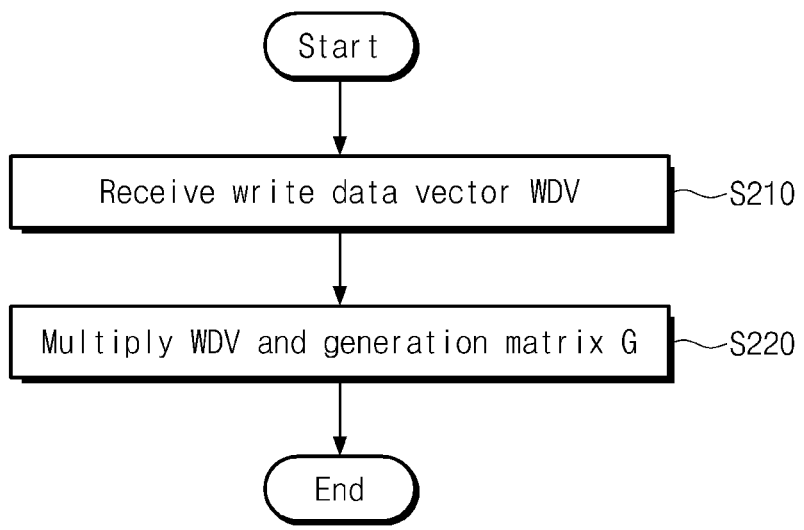
FIG. 3 is a flowchart illustrating an operation of encoding a write data vector in FIG. 2 according to exemplary embodiments of the present general inventive concept.

FIG. 3 is a flowchart illustrating an operation S110 of encoding a write data vector WDV in FIG. 2. Referring to FIGS. 1 and 3, in operation S210, an ECC encoder 300 may receive a write data vector WDV. For example, the write data vector WDV may be received from an external host (e.g., the host 10 illustrated in FIG. 1). A read vector RV may be read from the memory device 100 by the controller 200, an error of the read vector RV may be corrected (e.g., by the ECC decoder 400), an error-corrected data vector CDV may be extracted from the read vector RV by the controller 200, and the extracted error-corrected data vector CDV may be used as a write data vector WDV.

In operation S220, the ECC encoder 300 may multiply a generation matrix G and the write data vector WDV. For example, the generation matrix G may be a generation matrix G of a BCH (Bose-Chaudhuri-Hocquenghem) code. A multiplication result may be a code vector CV.

Figure 4:
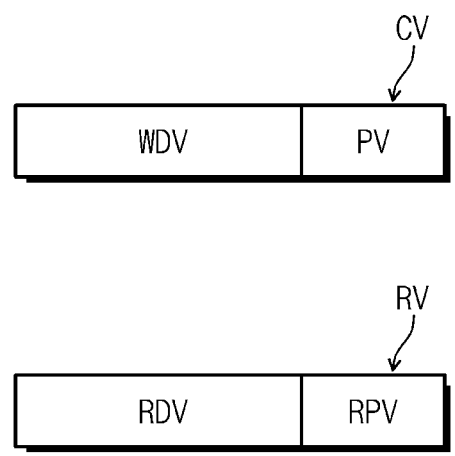
FIG. 4 is a diagram illustrating a code vector and a read vector according to exemplary embodiments of the present general inventive concept.

FIG. 4 is a diagram illustrating a code vector and a read vector according to exemplary embodiments of the present general inventive concept. Referring to FIG. 4, a code vector CV may include a write data vector WDV and a parity vector PV. The parity vector PV may be a cyclic redundancy check code (CRCC). The read vector RV may include a read data vector RDV and a read parity vector RPV. When the write data vector WDV is written in and then read from the memory device 100, the read data vector RDV may be the read result. When the read parity vector RPV is written in and then read from the memory device 100, the read parity vector RPV may be the read result.

Figure 5:
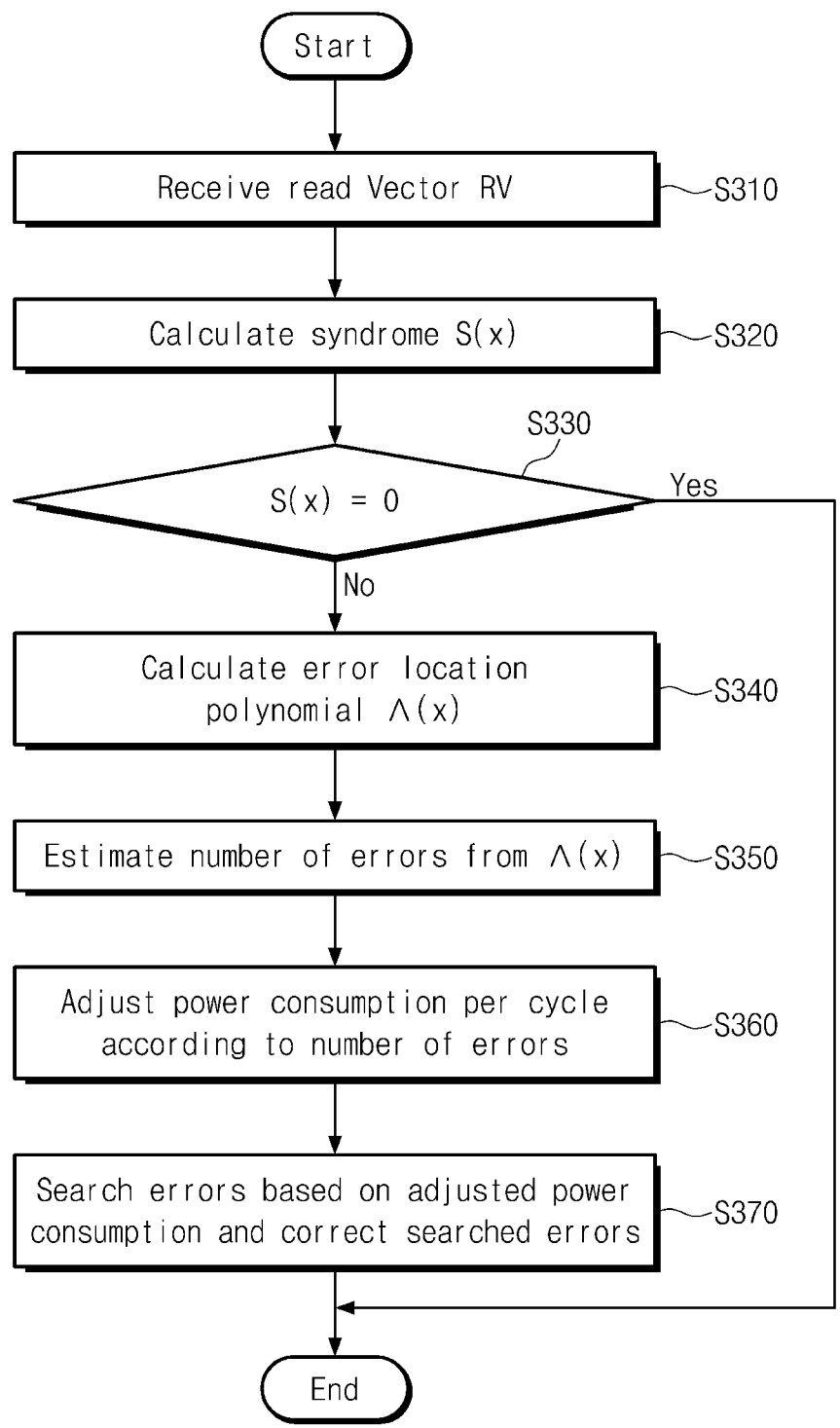
FIG. 5 is a flowchart illustrating an operation of decoding a read vector with cycle-per-power consumption being controlled according to exemplary embodiments of the present general inventive concept.
Figure 7:
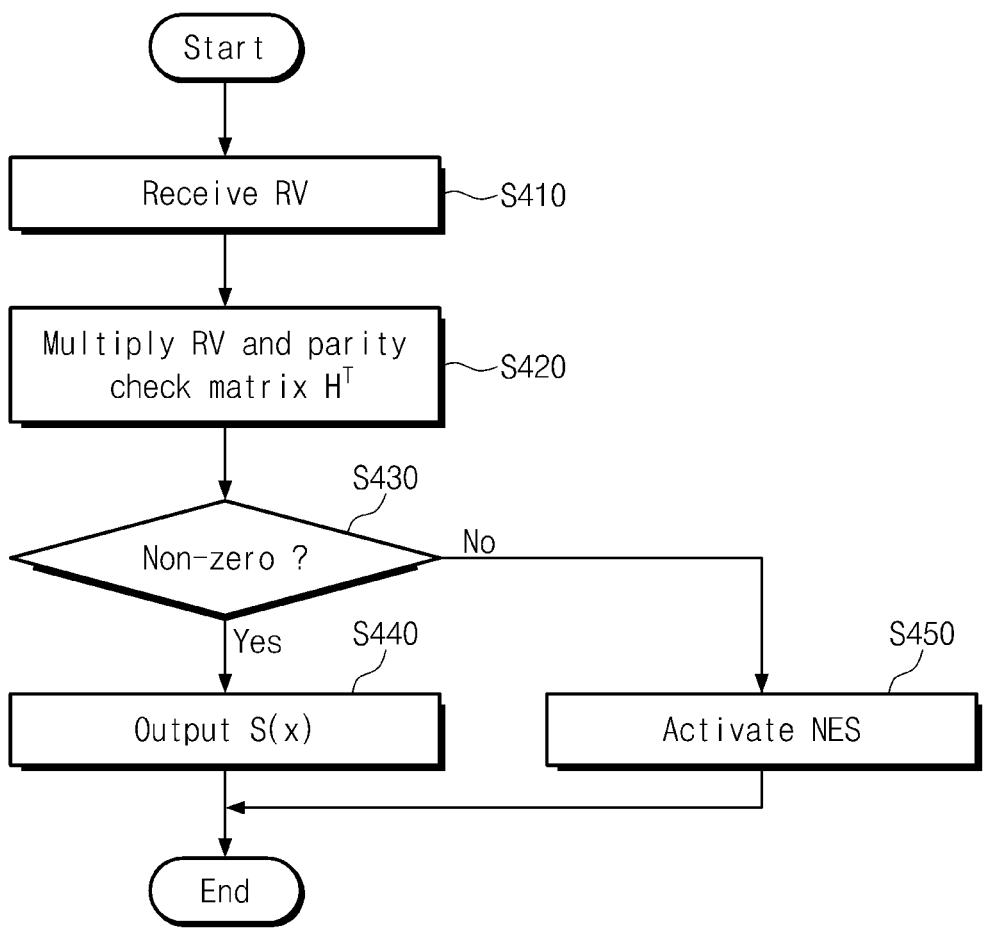
FIG. 7 is a flowchart illustrating a syndrome calculating method according to exemplary embodiments of the present general inventive concept.

FIG. 5 is a flowchart illustrating an operation S140 of decoding a read vector with cycle-per-power consumption being controlled. Referring to FIGS. 1 and 5, in operation S310, a read vector RV may be received by the controller 200. In operation S320, a syndrome S(x) may be calculated according to the read vector RV. An ECC decoder 400 may calculate the syndrome S(x) depending upon the input read vector RV. As illustrated in FIG. 7 and described in detail below, the syndrome S(x) may be calculated by multiplying the read vector RV with a parity check matrix. In operation S330, it may be determined (e.g., by the ECC decoder 400 and/or the controller 200) whether the syndrome S(x) is 0. If the syndrome S(x) is 0, no error may exist in the read vector RV. In this case, the ECC decoder 400 may end an error correcting operation. If the syndrome S(x) is determined not to be 0, operation S340 may be performed.

Figure 8:
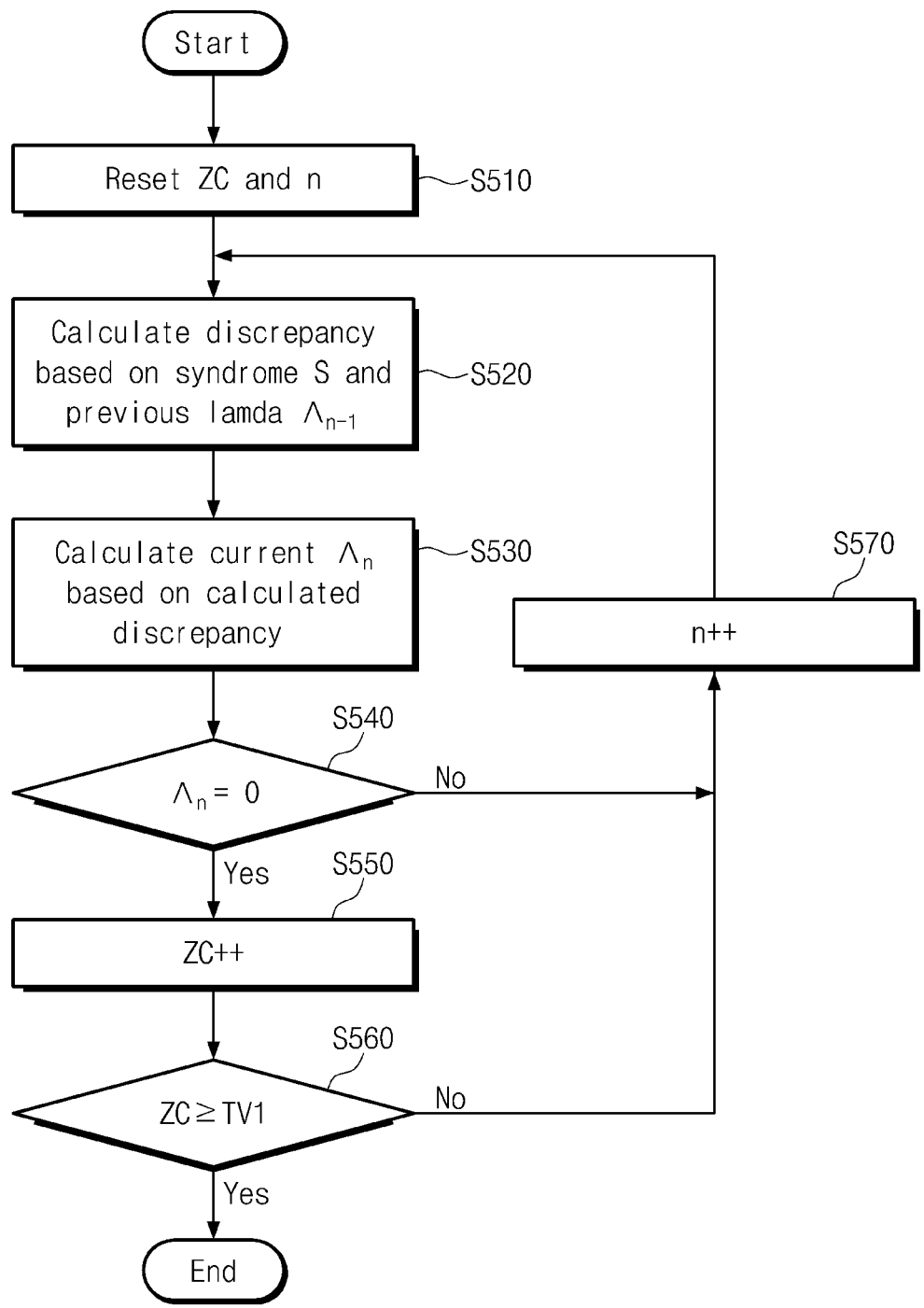
FIG. 8 is a flowchart illustrating an error location polynomial calculating method according to exemplary embodiments of the present general inventive concept.

In operation S340, an error location polynomial $\Lambda(x)$ of the read vector RV may be calculated. The ECC decoder 400 may calculate the error location polynomial $\Lambda(x)$ based upon the calculated syndrome S(x), as illustrated in FIG. 8 and described in detail below.

In operation S350, the number of errors may be estimated from the error location polynomial $\Lambda(x)$. For example, the ECC decoder 400 may estimate the number of errors of the read vector RV according to an index of the highest degree of the error location polynomial $\Lambda(x)$. That is, if an error location polynomial is: $\Lambda(x) = \Lambda_0 + \Lambda_1 X^1 + \Lambda_2 X^2 + \ldots + \Lambda_{64} X^{64}$, the estimate number of errors according to the index of the highest degree of the error location polynomial $\Lambda(x)$ may be 64.

In operation S360, cycle-per-power consumption may be adjusted according to the estimated error number. For example, the ECC decoder 400 may reduce cycle-per-power consumption when the number of errors in the read vector RV increases. The ECC decoder 400, for example, may reduce cycle-per-power consumption by adjusting the number of error bits to be detected at the same time. As illustrated in at least FIG. 11 and described in detail below, the number of error bits to be detected at the same time may be adjusted by selecting a half operation mode and/or a quarter operation mode, rather than a full operation mode. That is, half the number of bits are simultaneously searched per cycle when operating in a half search mode in comparison to a full operation mode. Similarly, one quarter of the number of bits may be simultaneously searched in the quarter search mode than in the full operation mode. As described in detail below, the half operation mode and/or the quarter operation mode can be selected when the number of errors in the read vector increases beyond at least one predetermined threshold number of errors, respectively. Thus, when the number of errors in the read vector is greater than at least one predetermined threshold value, the number of bits simultaneously searched in a half and/or quarter operation mode is less than in the full search mode, and the power consumption of the half and/or quarter search modes is less than the full search mode.

In operation S370, errors in the read vector RV may be searched according to the adjusted cycle-per-power consumption, and the searched errors may be corrected. The errors may be searched by a chien search unit (e.g., chien search unit 440 illustrated in FIG. 6 and described below), and the searched errors may be corrected by an error correcting unit 450, described in detail below.

Figure 6:
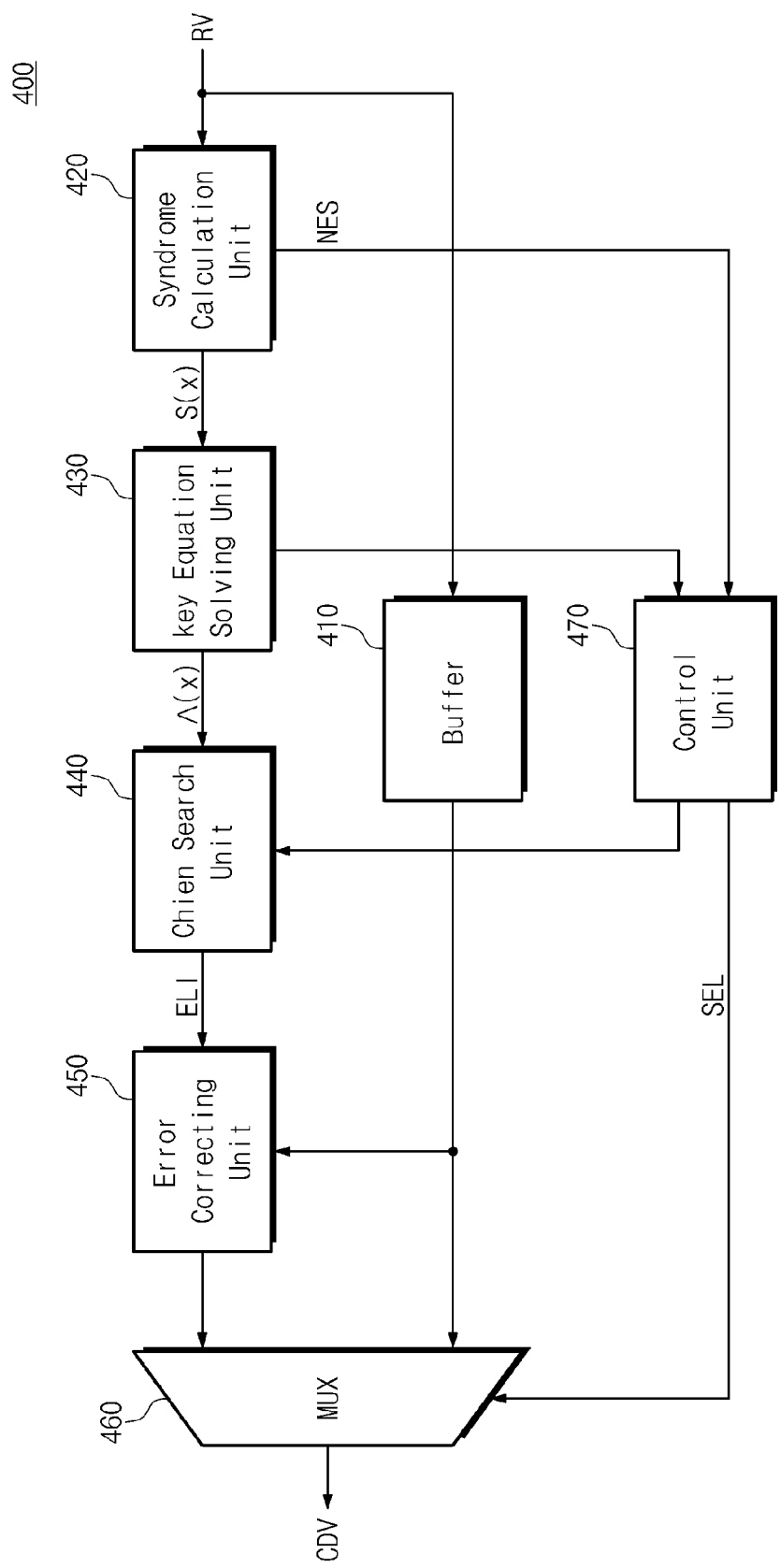
FIG. 6 is a block diagram illustrating an error correction code (ECC) decoder in FIG. 1 according to exemplary embodiments of the present general inventive concept.

FIG. 6 is a block diagram illustrating an ECC decoder 400 in FIG. 1 according to exemplary embodiments of the present general inventive concept. Referring to FIG. 6, an ECC decoder 400 may include a buffer 410, a syndrome calculation unit 420, a key equation solving (KES) unit 430, a chien search unit 440, an error correcting unit 450, a multiplexer 460, and a control unit 470.

The buffer 410 may store a read vector RV read from a memory device 100. The read vector RV stored in the buffer 410 may be output to the error correcting unit 450 and the multiplexer 460.

The syndrome calculation unit 420 may calculate a syndrome S(x) according to the read vector RV read from the memory device 100. The syndrome calculation unit 420 may calculate the syndrome S(x) by, for example, multiplying the received read vector and a parity check matrix, as described in detail below in connection with FIG. 7. The calculated syndrome S(x) may be output to the KES unit 430. When the calculated syndrome S(x) is 0, the syndrome calculation unit 420 may activate a control signal NES to be provided to the control unit 470.

The KES unit 430 may calculate an error location polynomial $\Lambda(x)$ according to the calculated syndrome S(x) which is received from the syndrome calculation unit 420. The KES unit 430 may calculate the error location polynomial $\Lambda(x)$ by a method illustrated in FIG. 8, which is described in detail below. The calculated error location polynomial $\Lambda(x)$ may also be output to the chien search unit 440. The KES unit 430 may output the error location polynomial $\Lambda(x)$ or information about an index of the error location polynomial $\Lambda(x)$ to the control unit 470. For example, an index of the highest degree (order) of the error location polynomial $\Lambda(x)$ may be output to the control unit 470.

The chien search unit 440 may search error locations of the read vector RV based upon the calculated error location polynomial $\Lambda(x)$ and information received from the control unit 470. For example, the chien search unit 440 may search the calculated error location polynomial $\Lambda(x)$ based on information provided by the KES unit 430. The search result may correspond to error locations of the read vector RV. That is, an operation of searching error locations of the read vector RV may include searching the error location polynomial $\Lambda(x)$ and determining error locations of the read vector RV according to the search result. That is, location of errors in the read vector RV may be determined. Information about error locations of the read vector RV may be output to the error correcting unit 450 as error location information ELI.

The error correcting unit 450 may correct errors of the read vector RV stored in the buffer 410 using the error location information ELI. For example, the error correcting unit 450 may invert bits (e.g., change a '0' bit to a '1' bit, or change a '1' bit to a '0' bit) corresponding to the error location information ELI among bits of the read vector RV. An output of the error correcting unit 450 may be provided to the multiplexer 460.

The multiplexer 460 may select a vector output from the buffer 410 or a vector output from the error correcting unit 450 as an error-corrected data vector CDV according to the control of the control unit 470. That is, the control unit 470 may provide a selection signal SEL to the multiplexer 460 to control the selection of the data vector output from the buffer 410 or the data vector output from the error correcting unit 450.

The control unit 470 may control the operations of the ECC decoder 400 as illustrated in FIGS. 1 and 6. The control unit 470 may receive the control signal NES from the syndrome calculation unit 420. When the control signal NES is activated, that is, when the calculated syndrome S(x) is 0, the control unit 470 may control a selection signal SEL such that the multiplexer 460 selects an output of the error correcting unit 450 (e.g., selects a read vector from the buffer 410 or the error-corrected data vector CDV from the error correcting unit 450).

The control unit 470 may measure and/or estimate the number of errors of the read vector RV using the error location polynomial Λ (x) transferred from the KES unit 430 or information on the error location polynomial Λ (x) received from the KES unit 430. For example, the control unit 470 may estimate an index of the highest degree of the error location polynomial Λ (x) as the number of errors of the read vector RV (e.g., if an error location polynomial Λ (x)=Λ$_0$+Λ X$^1$+ Λ X$^2$+ . . . +Λ$_{64}$X$^{64}$, the estimate number of errors according to the index of the highest degree of the error location polynomial Λ (x) may be 64). According to the estimated error number, the control unit 470 may adjust cycle-per-power consumption of the chien search unit 440. The control unit 470, for example, may reduce the cycle-per-power consumption of the chien search unit 440 when the estimated number of errors increases. In exemplary embodiments of the present general inventive concept, the control unit 470 may adjust cycle-per-power consumption of the chien search unit 440 by adjusting the number of bits of the read data vector to be searched at the same time by the chien search unit 440.

FIG. 7 is a flowchart illustrating a syndrome calculating method according to exemplary embodiments of the present general inventive concept. The syndrome calculation unit 420 illustrated in FIG. 6 may operate so as to perform the syndrome calculating method illustrated in FIG. 7. Referring to FIGS. 6 and 7, in operation S410, a read vector RV may be received (e.g., the read vector may be received by the controller 200 illustrated in FIG. 1). For example, the read vector RV may be provided to a syndrome calculation unit 420 from a memory device 100.

In operation S420, the read vector RV may be multiplied with a parity check matrix H$^T$. The syndrome calculation unit 420 may store the parity check matrix H$^T$ that is to be multiplied with the read vector RV. The syndrome calculation unit 420 may multiply the previously stored parity check matrix H$^T$ and the read vector RV received from the memory device 100. A multiplication result of the parity check matrix H$^T$ and the read vector RV may be a syndrome S(x).

Operation S430 may determine whether the multiplication result, that is, the syndrome S(x), is 0. If the multiplication result, that is, the syndrome S(x), is determined not to be 0 (i.e., S(x) is a non-zero value), the syndrome S(x) may be output at operation S440. If the multiplication result, that is, the syndrome S(x), is determined to be 0, a control signal NES may be activated at operation S450.

The syndrome calculation unit 420 illustrated in FIG. 6 may determine whether the calculated syndrome S(x) is 0. If the calculated syndrome S(x) is non-zero, the syndrome calculation unit 420 may output the calculated syndrome S(x) to a KES unit 430. If the calculated syndrome S(x) is 0, the syndrome calculation unit 420 may activate the control signal NES to be received by the control unit 470.

Below, a syndrome calculating method will be described using the following equations. A code vector CV may be expressed by the following equation 1, where WDV is a write data vector and G is a generation matrix (e.g., a generation matrix of a BCH code, as described in detail above).

$$CV=WDV\times G \qquad (1)$$

A read vector RV read from the memory device 100 may include an error. A read vector RV including an error may be expressed by the following equation 2, where WDV is a write data vector, G is a generation matrix, and E is an error vector.

$$RV=WDV\times G+E \qquad (2)$$

The read vector RV may be multiplied with a parity check matrix H$^T$. A multiplication result may be expressed by the following equation, where WDV is a write data vector, G is a generation matrix, and E is an error vector.

$$RV\times H^T=WDV\times G\times H^T+E\times H^T \qquad (3)$$

A generation matrix G and the parity check matrix H$^T$ may be determined to satisfy a relationship of the following equation.

$$G\times H^T=0 \qquad (4)$$

Accordingly, the following equation 5 may be obtained by substituting the equation 4 into the equation 3.

$$RV\times H^T=E\times H^T \qquad (5)$$

A multiplication result may be the syndrome S(x). If the syndrome S(x) is 0, no error may be determined to exist. If the syndrome S(x) is non-zero, an error may be determined to exist.

FIG. 8 is a flowchart illustrating an error location polynomial (Λ (x)) calculating method according to exemplary embodiments of the present general inventive concept. The KES unit 430 illustrated in FIG. 6 may operate so as to calculate an error location polynomial Λ (x) according to the method illustrated in FIG. 8. As described in detail below, coefficients of the error location polynomial may be iteratively calculated to determine the number of coefficients that have a '0' value while a count of the number of zero value coefficients is less than a threshold value. The control unit 470 illustrated in FIG. 6 may select an operation mode of the chien search unit 440 (e.g., a full search mode, a half search mode, a quarter search mode) according to the number of coefficients with a '0' value. It is to be noted that the search mode is not limited to full, half or quarter, but may be determined to be any fractional search mode desired depending on the desired power consumption. Referring to FIGS. 6 and 8, in operation S510, a zero count ZC and a variable n may be reset. For example, a KES unit 430 may reset the zero count ZC and the variable n. As discussed in detail below, the zero count ZC may be incremented when a calculated coefficient Λ n of the error location polynomial Λ (x) is 0, and if the zero count ZC is smaller than a first threshold value TV1 or a calculated coefficient $\Lambda$ n is non-zero, the variable n may be increased and/or incremented.

In operation S520, a discrepancy may be calculated using a syndrome S(x) and a coefficient $\Lambda$ n−1 of a previous operation. If the coefficient $\Lambda$ n−1 of a previous operation does not exist, that is, in the event that the first coefficient $\Lambda$ 0 is calculated, the discrepancy may be calculated according to the syndrome S(x). The discrepancy may be calculated by the KES unit 430.

In operation S530, a coefficient $\Lambda$ n may be calculated according to the calculated discrepancy. The coefficient $\Lambda$ n may be calculated by the KES unit 430.

In operation S540, the KES unit 430 may determine whether the calculated coefficient $\Lambda$ n is 0. In operation S550, when the calculated coefficient $\Lambda$ n is 0, the zero count ZC may increase. In operation S560, the KES unit 430 may determine whether the zero count ZC is identical to or larger than a first threshold value TV1. That is, the KES unit 430 may determine whether the number of calculated coefficients $\Lambda$ n having a zero value is greater than or equal to a first threshold value TV1. If the zero count ZC is identical to or larger than the first threshold value TV1, calculation on the error location polynomial $\Lambda$ (x) may be ended. If the zero count ZC is smaller than the first threshold value TV1 or the calculated coefficient $\Lambda$ n is non-zero, in operation S570, the variable n may increase. When the n value is increased and/or incremented, the method may return to operation S520.

That is, until a count indicating that the calculated coefficient $\Lambda$ n is 0 is greater than or equal to the first threshold value TV1, the KES unit 430 may increase the variable n and may iteratively calculate the coefficient $\Lambda$ n of the error location polynomial $\Lambda$ (x). The calculated coefficient $\Lambda$ n may be a coefficient of a degree n of the error location polynomial $\Lambda$ (x). In exemplary embodiments of the present general inventive concept, the error location polynomial may be expressed by the following equation 6.

$$\Lambda(x) = \Lambda_0 + \Lambda_1 x + \Lambda_2 x^2 + I + \Lambda_n x^n \quad (6)$$

In exemplary embodiments of the present general inventive concept, the first threshold value TV1 may be 3. That is, when a coefficient of the error location polynomial $\Lambda$ (x) is calculated to be 0 three times or more, the KES unit 430 may end the calculation of the error location polynomial $\Lambda$ (x) and the number of orders may be estimated.

Roots of the error location polynomial $\Lambda$ (x) may indicate error locations of the read vector RV. That is, the read vector RV may include errors corresponding to the number of roots of the error location polynomial $\Lambda$ (x). Determination of the errors corresponding to the roots is described in detail below in connection with FIGS. 9 and 10. An index of the highest degree (in particular, an index of the highest degree having a non-zero coefficient) of the error location polynomial $\Lambda$ (x) may indicate the number of errors. That is, if an error location polynomial is: $\Lambda(x) = \Lambda + \Lambda_1 X^1 + \Lambda_2 X^2 + \ldots + \Lambda_{64} X^{64}$, the index of the highest degree of the error location polynomial $\Lambda$ (x) may be 64, which may indicate 64 errors.

In exemplary embodiments of the present general inventive concept, a key equation solving (KES) calculation may be made according to the BM (Berlekamp-Massey) algorithm or the ME (Modified Euclidean) algorithm.

Figure 9:
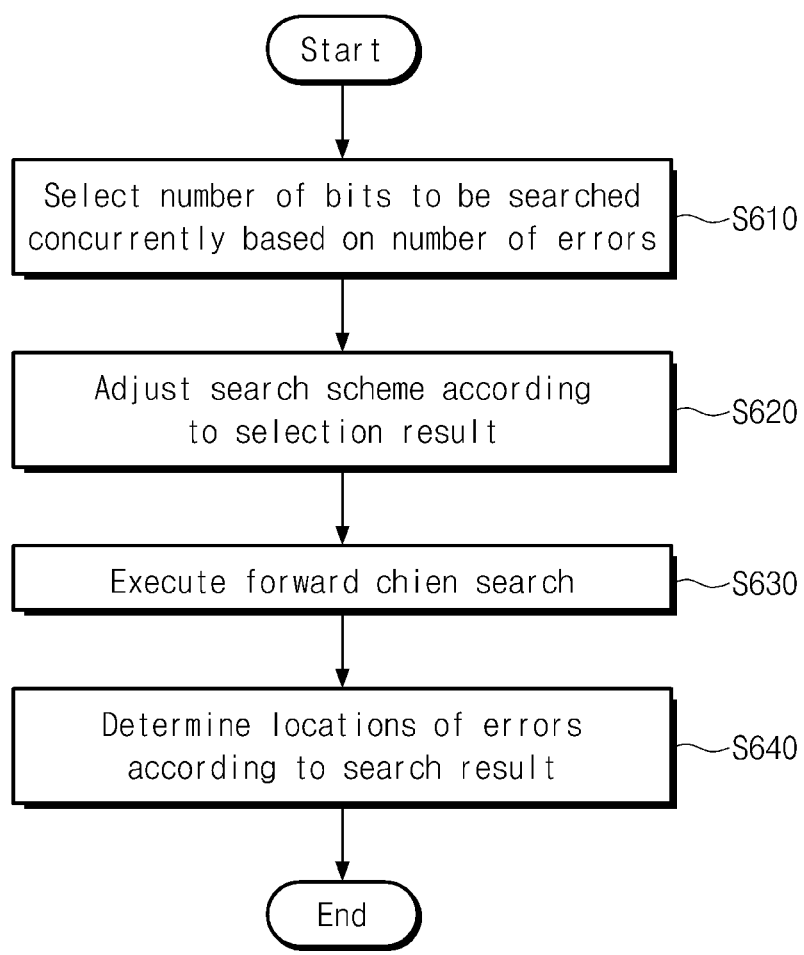
FIG. 9 is a flowchart illustrating a chien search method according to exemplary embodiments of the present general inventive concept.

FIG. 9 is a flowchart illustrating a chien search method according to exemplary embodiments of the present general inventive concept. The chien search unit 440 of the ECC decoder illustrated in FIG. 6 may operate so as to perform the method illustrated in FIG. 9. Referring to FIGS. 6 and 9, in operation S610, the number of bits to be searched simultaneously in a read vector that is received by the ECC decoder 400 may be selected according to the determined number of errors. A control unit 470 may determine the number of errors in a read vector RV according to information input from the KES unit 430. That is, the KES unit 430 may calculate an error location polynomial $\Lambda$ (x) to be provided to the chien search unit 440, and also determine the number of coefficients of the error location polynomial $\Lambda$ (x) with a 0 value. The control unit 470 may select the number of bits of the read vector to be searched at the same time, based upon the determined and/or estimated number of errors in the read vector.

In operation S620, a search scheme may be adjusted according to the selected result. For example, the control unit 470 may control a chien search unit 440 so as to conduct a search operation according to a search scheme corresponding to the number of selected bits to be simultaneously searched. As discussed in detail below, the control unit 470 may control the chien search unit 440 to operate, for example, in a full search mode, a half search mode, or a quarter search mode. However, the fractional value of search modes is not limited to these values, and can be adjusted as desired. The chien search unit 440, when operating in the half search mode, may simultaneously search one half of the number of bits of the received read vector as when operating in the full search mode. The chien search unit 440, when operating in the quarter search mode, and may simultaneously search one quarter of the number of bits of the received read vector as when operating in the in the full search mode.

Power consumption of the chien search unit 440 may be adjusted according to the number of bits of the read vector to be searched concurrently. In exemplary embodiments of the present general inventive concept, the operations S610 and S620 may be part or all of operation S360 in FIG. 5 in which cycle-per-power consumption is adjusted.

In operation S630 illustrated in FIG. 9, a forward chien search operation may be executed by the chien search unit 440. The forward chien search operation may be executed from the first bit of an end of a data portion (e.g., the read data vector RDV of the read vector RV illustrated in FIG. 4) of the read vector RV to the beginning of the parity portion of the read vector (e.g., the read parity vector RPV of the read vector RV illustrated in FIG. 4). At the chien search operation, error locations of the read vector RV may be searched. The chien search operation may be performed according to the number of simultaneously searched bits selected in operation S610. The chien search operation performed by the chien search unit 440 may be controlled by the control unit 470 so as to search the data portion of the read vector, or the data and parity portion of the read vector.

The chien search unit 440 may perform a search on the error location polynomial $\Lambda$ (x) provided by the KES unit 430. The chien search unit 440 may search roots of the error location polynomial $\Lambda$ (x). A searching operation of the chien search unit 440 may correspond to an operation of searching error locations by unit, which is determined according to the number of selected bits of the read vector, from the first bit of an end of a data portion of the read vector RV (e.g., the read data vector RV of the red vector RV illustrated in FIG. 4). As discussed in detail below, the chien search unit 440 may be operated in different modes, such as, for example, a full operation mode (i.e., full search mode), a half operation mode (i.e., a half search mode), and a quarter operation mode (i.e., a quarter search mode). The unit number of bits to be searched in the data portion of the read vector may be different according to the operation mode selected. As illustrated, for example, in FIG. 11, the unit number of bits searched in the quarter operation mode is less the unit number of bits in the half operation mode or the full operation mode.

In operation S640, error locations may be determined according to the searching result. The chien search unit 440 may determine error locations of the read vector RV at least according to the searched roots of the error location polynomial $\Lambda(x)$. The determination of the error locations of the read vector is discussed in detail below, at least in connection with FIG. 10. The chien search unit 440 may output error location information (ELI) according to the determined error locations.

Roots of the error location polynomial $\Lambda(x)$ may be obtained via execution of the chien search by the chien search unit 440 illustrated in FIG. 6. In exemplary embodiments of the present general inventive concept, when the error location polynomial $\Lambda(x)$ satisfies the following equation 7, a square number $\alpha^i$ of a primitive element $\alpha$ may be a root of the error location polynomial $\Lambda(x)$.

$$\Lambda(\alpha^i) = \Lambda_0 + \Lambda_1\alpha^i + \Lambda_2\alpha^{2i} + I + \Lambda_n\alpha^{ni} = 0 \text{ or} \quad (7)$$

Roots of the error location polynomial $\Lambda(x)$ may be expressed by an index form of the primitive element $\alpha$. Error locations of the read vector RV may be inverted values of indexes of roots of the error location polynomial $\Lambda(x)$. For example, when a root of the error location polynomial $\Lambda(x)$ is $(\alpha-k)$, the (k+1)th bit of the read vector RV may be an error bit. In particular, the (k+1)th bit from an end of a parity portion of the read vector RV (e.g., the read parity vector RPV of the read vector RV) may be an error bit. When the read vector RV has a c-bit length, roots of the error location polynomial $\Lambda(x)$ may be values between $\alpha^0$ and $\alpha^{ni}$. Herein, 'c' of the c-bit length may indicate a length of the read vector RV (i.e., the number of bits of the read vector RV). Determination of the error locations of the read vector RV is explained in detail below, at least in connection with FIG. 10.

Roots of the error location polynomial $\Lambda(x)$ may be searched via execution of the chien search by the chien search unit 440. That is, error locations of the read vector RV may be determined according to the chien search result. The chien search unit 440 may output error location information ELI to an error correcting unit 450 according to the searching result. The error correcting unit 450 may correct errors of the read vector RV by inverting bits of at least the data portion of the read vector at locations designated by the error location information ELI. The operations S630 and S640 may be part or all of an operation S370 in FIG. 5 in which errors are corrected.

Figure 10:
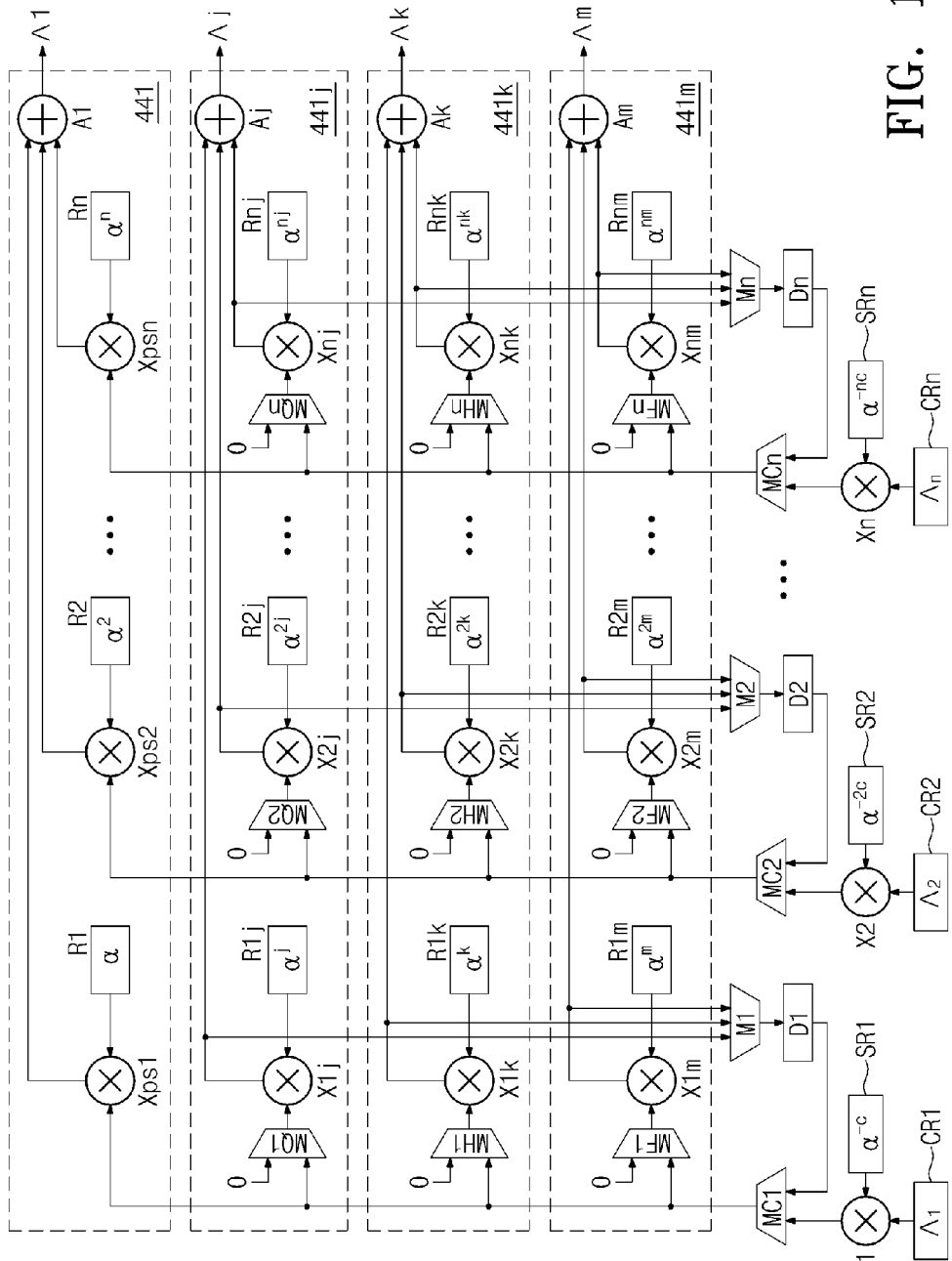
FIG. 10 is a diagram illustrating a chien search unit in FIG. 6 according to exemplary embodiments of the present general inventive concept.

FIG. 10 is a detailed diagram illustrating the chien search unit 440 of FIG. 6 according to exemplary embodiments of the present general inventive concept. Referring to FIG. 10, coefficients $\Lambda_0$ to $\Lambda_n$ of an error location polynomial $\Lambda(x)$ may be stored in coefficient registers CR1 to CRn, respectively. For example, the coefficients $\Lambda_0$ to $\Lambda_n$ of the error location polynomial $\Lambda(x)$ may be transferred from a KES unit 430 in FIG. 6.

Seeds may be stored in seed registers SR1 to SRn, respectively. In exemplary embodiments of the present general inventive concept, seeds stored in the seed registers SR1 to SRn may be square numbers of a primitive element $\alpha$ (e.g., seeds may be the primitive element $\alpha$ that is squared). Seeds stored in the seed registers SR1 to SRn may be $\alpha-c$ to $\alpha-nc$. As discussed above, 'c' may indicate a length of a read vector RV, that is, the number of bits of the read vector RV.

Outputs of the coefficient registers CR1 to CRn and outputs of the seed registers SR1 to SRn may be multiplied by multipliers (e.g., multipliers X1, X2, . . . Xn), respectively. Multiplication results may be transferred from the multipliers X1 to Xn to the first inputs of coefficient multiplexers MC1 to MCn, respectively. Outputs of delays D1 to Dn may be provided to the second inputs of the coefficient multiplexers MC1 to MCn, respectively.

Each of the coefficient multiplexers MC1 to MCn may output one of an output of a corresponding multiplier and an output of a corresponding delay. The coefficient multiplexers MC1 to MCn may operate according to the control of a control unit 470 in FIG. 6. Outputs of the coefficient multiplexers MC1 to MCn may be transferred to parallel search logics 441, 441$j$, 441$k$, and/or 441$m$.

The parallel search logic 441 may include parallel search registers R1 to Rn. Square numbers $\alpha$, $\alpha2$, . . . , $\alpha n$ of a primitive element $\alpha$ may be stored in the parallel search registers R1 to Rn, respectively. In exemplary embodiments of the present general inventive concept, respective terms may be stored in the parallel search registers R1 to Rn, respectively. Herein, each term may be obtained by removing a constant A0 from an error location polynomial $\Lambda(x)$, replacing coefficients $\Lambda 1 \sim \Lambda n$ with 1, and substituting the primitive element $\alpha$.

Each of the parallel search multipliers (e.g., multipliers Xps1, Xps2, . . . Xpsn; multipliers X1$j$, X2$j$, . . . Xn$j$; multipliers X1$k$, X2$k$, . . . XnK; and multipliers X1$m$, X2$m$, . . . Xn$m$) may multiply an output of a corresponding coefficient multiplexer MCi (i=1–n) and an output of a corresponding parallel search register Ri (e.g., parallel search registers R1, R2, . . . Rn; parallel search registers R1$j$ to Rn$j$; parallel search registers R1$k$ to R1$n$; and parallel search registers R1$m$ to R1$nm$). Outputs of the parallel search multipliers (e.g., multipliers Xps1, Xps2, . . . Xpsn) may be added by a parallel search adder in the parallel search logic 441 (e.g., by parallel search added A1). Outputs of the parallel search multipliers X1$j$ to Xn$j$, multipliers X1$k$ to XnK, and multipliers X1$m$ to Xn$m$ may be added by parallel search adders A$j$, A$k$, and A$m$, respectively. An output of the parallel search adder A1 may be an output $\Lambda$ 1 of the parallel search logic 441. Outputs of the parallel search adders A$j$, A$k$, and A$m$, respectively, may be outputs $\Lambda j$, $\Lambda k$, and $\Lambda m$ of the parallel search logics 441$j$, 441$k$, and 441$m$, respectively.

The parallel search logic 441$j$ (i.e., the quarter parallel search logic to operate in a quarter search mode) may include parallel search registers R1$j$ to Rn$j$. Square numbers $\alpha j$, $\alpha 2j$, . . . , $\alpha n j$ of a primitive element $\alpha$ may be stored in the parallel search registers R1$j$ to Rn$j$, respectively. In exemplary embodiments of the present general inventive concept, respective terms may be stored in the parallel search registers R1$j$ to Rn$j$, respectively. Herein, each term may be obtained by removing a constant $\Lambda_0$ from the error location polynomial $\Lambda(x)$, replacing coefficients $\Lambda_1 \sim \Lambda_n$ with 1, and substituting the primitive element $\alpha^i$.

Each of quarter multiplexers MQ1 to MQn (e.g., of the quarter parallel search logic 441$j$) may output one of an output of a corresponding coefficient multiplexer MCi and a zero value. The quarter multiplexers MQ1 to MQn may operate according to the control of the control unit 470. Outputs of the quarter multiplexers MQ1 to MQn may be transferred to parallel search multipliers (e.g., parallel search multipliers X1$j$, X2$j$, . . . Xn$j$), respectively.

Each of the parallel search multipliers (e.g., parallel search multipliers X1$j$, X2$j$, . . . Xn$j$) may multiply an output of a corresponding quarter multiplexer MQi (e.g., MQ1, MQ2, . . . MQn) and an output of a corresponding parallel search register Ri$j$ (e.g., parallel search registers R1$j$, R2$j$, . . . Rn$j$). Outputs of the parallel search multipliers (e.g., parallel search multipliers X1$j$, X2$j$, . . . Xn$j$) may be added by a parallel search adder Aj in the parallel search logic 441j. An output of the parallel search adder Aj may be an output $\wedge$ j of the parallel search logic 441j.

The parallel search logic 441k (i.e., the half parallel search logic to operate in a half search mode) may include parallel search registers R1k to Rnk. Square numbers $\alpha^k, \alpha^{2k}, \ldots, \alpha^{nk}$ of a primitive element $\alpha$ may be stored in the parallel search registers R1k to Rnk, respectively. In exemplary embodiments of the present general inventive concept, respective terms may be stored in the parallel search registers R1k to Rnk, respectively. Herein, each term may be obtained by removing a constant $\wedge_0$ from the error location polynomial $\wedge$ (x), replacing coefficients $\wedge_1 \sim \wedge_n$ with 1, and substituting the primitive element $\alpha^k$.

Each of half multiplexers MH1 to MHn of the half parallel search logic 441k may output one of an output of a corresponding coefficient multiplexer MCi (e.g., MC1, MC2, . . . MCn) and a zero value. The half multiplexers MH1 to MHn may operate according to the control of the control unit 470. Outputs of the half multiplexers MH1 to MHn may be transferred to parallel search multipliers (e.g., multipliers X1k, X2k, and Xnk), respectively.

Each of the parallel search multipliers (e.g., multipliers X1k, X2k, and Xnk) may multiply an output of a corresponding half multiplexer MHi and an output of a corresponding parallel search register Rij (e.g., parallel search registers R1k, R2k, and Rnk). Outputs of the parallel search multipliers (e.g., multipliers X1k, X2k, and Xnk) may be added by a parallel search adder Ak in the parallel search logic 441k. An output of the parallel search adder may be an output $\wedge$ k of the parallel search logic 441k.

The parallel search logic 441m (e.g., a full parallel search logic) may include parallel search registers R1m to Rnm. Square numbers $\alpha^m, \alpha^{2m}, \ldots, \alpha^{nm}$ of a primitive element $\alpha$ may be stored in the parallel search registers R1m to Rnm, respectively. In an exemplary embodiment, respective terms may be stored in the parallel search registers R1m to Rnm, respectively. Herein, each term may be obtained by removing a constant $\wedge_0$ from the error location polynomial $\wedge$ (x), replacing coefficients $\wedge_1 \sim \wedge_n$ with 1, and substituting the primitive element $\alpha^m$.

Each of full multiplexers MF1 to MFn may output one of an output of a corresponding coefficient multiplexer MCi (e.g., MC1, MC2, . . . MCn) and a zero value. The full multiplexers MF1 to MFn may operate according to the control of the control unit 470. Outputs of the full multiplexers MF1 to MFn may be transferred to parallel search multipliers (e.g., parallel search multipliers X1m, X2m, and Xnm), respectively.

Each of the parallel search multipliers (e.g., parallel search multipliers X1m, X2m, and Xnm) may multiply an output of a corresponding full multiplexer MFi (e.g., MF1, MF2, . . . MFn) and an output of a corresponding parallel search register Rim. Outputs of the parallel search multipliers (e.g., parallel search multipliers X1m, X2m, and Xnm) may be added by a parallel search adder in the parallel search logic 441m. An output of the parallel search adder Am may be an output $\wedge$ m of the parallel search logic 441m.

Outputs of the parallel search multipliers (e.g., multipliers Xps1, Xps2, . . . Xpsn; multipliers X1j, X2j, . . . Xnj; multipliers X1k, X2k, . . . XnK; and multipliers X1m, X2m, . . . Xnm) in the parallel search logics 441j to 441m may be transferred to multiplexers M1 to Mn. For example, outputs of the parallel search multipliers each connected with parallel search registers R1j, R1k, and R1m may be transferred to the multiplexer M1. Outputs of the parallel search multipliers each connected with parallel search registers Rnj, Rnk, and Rnm may be transferred to the multiplexer Mn.

Each of the multiplexers M1 to Mn may select one of input signals according to the control of the control unit 470. For example, the multiplexer M1 may select one of outputs of the parallel search multipliers (e.g., multipliers Xps1, X1j, X1k, X1m) each connected with parallel search registers R1j, R1k, and R1m. The multiplexer Mn may select one of outputs of the parallel search multipliers (e.g., multipliers Xpsn, Xnj, Xnk, Xnm) each connected with parallel search registers Rnj, Rnk, and Rnm. Outputs of the multiplexers M1 to Mn may be provided to the delays D1 to Dn, respectively.

The parallel search logics 441 to 441m may search different error locations of the read vector RV. The parallel search logics 441 to 441m may search a plurality of error locations in parallel (or, at the same time). The parallel search logics 441 to 441m of the chien search unit 440 may be activated or inactivated according to the control of the control unit 470. The chien search unit 440 may adjust the number of bits of the read vector to be searched at the same time according to the control of the control unit 470. That is, the chien search unit 440 may adjust the number of bits of the read vector to be searched by operating in a full search mode, a half search mode, or a quarter search mode, as discussed in detail below. The chien search unit 440 may adjust cycle-per-power consumption or the maximum correction time according to the control of the control unit 470. Below, operations of the chien search unit 440 will be more fully described.

Full Search Mode

When the chien search unit 440 operates in a full search mode, the quarter multiplexers MQ1 to MQn in the parallel search logic 441j may be controlled to select outputs of the coefficient multiplexers MC1 to MCn. The half multiplexers MH1 to MHn in the parallel search logic 441k may be controlled to select outputs of the coefficient multiplexers MC1 to MCn. The full multiplexers MF1 to MFn in the parallel search logic 441m may be controlled to select outputs of the coefficient multiplexers MC1 to MCn. The multiplexers M1 to Mn may select outputs of the parallel search multipliers in the parallel search logic 441m.

At the first cycle, the coefficient multiplexers MC1 to MCn may be controlled to select outputs of multipliers (e.g., multipliers X1, X2, Xn). Outputs of the coefficient multiplexers MC1 to MCn may be transferred to the parallel search logics 441 to 441m. At this time, outputs $\wedge$ 1, $\wedge$ j, $\wedge$ k, and $\wedge$ m of the parallel search logics 441 to 441m may be illustrated in the following table 1.

TABLE 1

| $\wedge$ 1(441) | $\wedge 1 = \wedge_1 \alpha^{-c}\alpha + \wedge_2 \alpha^{-2c}\alpha^2 + \ldots + \wedge_n \alpha^{-nc}\alpha^n$ |
|---|---|
| | $= \wedge_1 \alpha^{-(c-1)} + \wedge_2 \alpha^{-2(c-1)} + \ldots + \wedge_n \alpha^{-n(c-1)}$ |
| $\wedge$ j(441j) | $\wedge i = \wedge_1 \alpha^{-c}\alpha^j + \wedge_2 \alpha^{-2c}\alpha^{2j} + \ldots + \wedge_n \alpha^{-nc}\alpha^{nj}$ |
| | $= \wedge_1 \alpha^{-(c-j)} + \wedge_2 \alpha^{-2(c-j)} + \ldots + \wedge_n \alpha^{-n(c-j)}$ |
| $\wedge$ k(441k) | $\wedge j = \wedge_1 \alpha^{-c}\alpha^k + \wedge_2 \alpha^{-2c}\alpha^{2k} + \ldots + \wedge_n \alpha^{-nc}\alpha^{nk}$ |
| | $= \wedge_1 \alpha^{-(c-k)} + \wedge_2 \alpha^{-2(c-k)} + \ldots + \wedge_n \alpha^{-n(c-k)}$ |
| $\wedge$ m(441m) | $\wedge k = \wedge_1 \alpha^{-c}\alpha^m + \wedge_2 \alpha^{-2c}\alpha^{2m} + \ldots + \wedge_n \alpha^{-nc}\alpha^{nm}$ |
| | $= \wedge_1 \alpha^{-(c-m)} + \wedge_2 \alpha^{-2(c-m)} + \ldots + \wedge_n \alpha^{-n(c-m)}$ |

An output $\Lambda 1$ of the parallel search logic 441 may be obtained by substituting $\alpha^{-(c-1)}$ into an error location polynomial $\Lambda(x)$. The parallel search logic 441 may search whether the $(c-1)^{th}$ bit of the read vector RV is erroneous. In particular, the parallel search logic 441 may detect an error existing at the first bit from an end of a data portion of the read vector RV (e.g., the read data vector RDV of the read vector RV illustrated in FIG. 4). When the output $\Lambda 1$ of the parallel search logic 441 is $-\Lambda_1$, it may indicate that an error exists.

An output $\Lambda j$ of the parallel search logic 441j may be obtained by substituting $\alpha^{-(c-j)}$ into the error location polynomial $\Lambda(x)$. The parallel search logic 441j may search whether the $(c-j)^{th}$ bit of the read vector RV is erroneous. In particular, the parallel search logic 441j may detect an error existing at the $j^{th}$ bit from an end of a data portion of the read vector RV (e.g., the read data vector RDV portion of the read vector RV illustrated in FIG. 4). When the output $\Lambda j$ of the parallel search logic 441 is $\Lambda_1$, it may indicate that an error exists.

An output $\Lambda k$ of the parallel search logic 441k may be obtained by substituting $\alpha^{-(c-k)}$ into an error location polynomial $\Lambda(x)$. The parallel search logic 441k may search whether the $(c-k)^{th}$ bit of the read vector RV is erroneous. In particular, the parallel search logic 441k may detect an error existing at the $k^{th}$ bit from an end of a data portion of the read vector RV (e.g., the read data vector RDV portion of the read vector RV illustrated in FIG. 4). When the output $\Lambda k$ of the parallel search logic 441m is $-\Lambda_1$, it may indicate that an error exists.

An output $\Lambda m$ of the parallel search logic 441m may be obtained by substituting $\alpha^{-(c-m)}$ into an error location polynomial $\Lambda(x)$. The parallel search logic 441m may search whether the $(c-m)^{th}$ bit of the read vector RV is erroneous. In particular, the parallel search logic 441m may detect an error existing at the $m^{th}$ bit from an end of a data portion of the read vector RV (e.g., the read data vector RDV portion of the read vector RV illustrated in FIG. 4). When the output $\Lambda m$ of the parallel search logic 441m is $-\Lambda_1$, it may indicate that an error exists.

During the first cycle of the full search mode, the parallel search logics 441 to 441m may simultaneously search the $1^{st}$, $j^{th}$, $k^{th}$, and $m^{th}$ bits from an end of a data portion of the read vector RV are erroneous.

At the second cycle, the coefficient multiplexers MC1 to MCn may select outputs of the delays D1 to Dn. That is, outputs of the parallel search registers R1m to Rnm in the parallel search logic 441m may be multiplied with outputs of the parallel search multipliers X1m to Xnm in the parallel search logic 441m at the first cycle. At this time, outputs $\Lambda 1$, $\Lambda j$, $\Lambda k$, and $\Lambda m$ of the chien search unit 440 may be illustrated in the following table 2.

TABLE 2

| $\Lambda 1(441)$ | $\Lambda 1 = \Lambda_1 \alpha^{-(c-m)}\alpha + \Lambda_2 \alpha^{-2(c-m)}\alpha^2 + \ldots + \Lambda_n \alpha^{-n(c-m)}\alpha^n$ |
|---|---|
|  | $= \Lambda_1 \alpha^{-(c-m-1)} + \Lambda_2 \alpha^{-2(c-m-1)} + \ldots + \Lambda_n \alpha^{-n(c-m-1)}$ |
| $\Lambda j(441j)$ | $\Lambda j = \Lambda_1 \alpha^{-(c-m)}\alpha^j + \Lambda_2 \alpha^{-2(c-m)}\alpha^{2j} + \ldots + \Lambda_n \alpha^{-n(c-m)}\alpha^{nj}$ |
|  | $= \Lambda_1 \alpha^{-(c-m-j)} + \Lambda_2 \alpha^{-2(c-m-j)} + \ldots + \Lambda_n \alpha^{-n(c-m-j)}$ |
| $\Lambda k(441k)$ | $\Lambda k = \Lambda_1 \alpha^{-(c-m)}\alpha^k + \Lambda_2 \alpha^{-2(c-m)}\alpha^{2k} + \ldots + \Lambda_n \alpha^{-n(c-m)}\alpha^{nk}$ |
|  | $= \Lambda_1 \alpha^{-(c-m-k)} + \Lambda_2 \alpha^{-2(c-m-k)} + \ldots + \Lambda_n \alpha^{-n(c-m-k)}$ |

TABLE 2-continued

| $\Lambda m(441m)$ | $\Lambda k = \Lambda_1 \alpha^{-(c-m)}\alpha^m + \Lambda_2 \alpha^{-2(c-m)}\alpha^{2m} + \ldots + \Lambda_n \alpha^{-n(c-m)}\alpha^{nm}$ |
|---|---|
|  | $= \Lambda_1 \alpha^{-(c-2m)} + \Lambda_2 \alpha^{-2(c-2m)} + \ldots + \Lambda_n \alpha^{-n(c-2m)}$ |

An output $\Lambda 1$ of the parallel search logic 441 may be obtained by substituting $\alpha^{-(c-m-1)}$ into the error location polynomial $\Lambda(x)$. The parallel search logic 441 may search the $(m+1)^{th}$ bit of the read vector RV to determine whether it is erroneous.

An output $\Lambda j$ of the parallel search logic 441j may be obtained by substituting $\alpha^{-(c-m-j)}$ into the error location polynomial $\Lambda(x)$. The parallel search logic 441j may search the $(m+j)^{th}$ bit of the read vector RV to determine whether it is erroneous.

An output $\Lambda k$ of the parallel search logic 441k may be obtained by substituting $\alpha^{-(c-m-k)}$ into the error location polynomial $\Lambda(x)$. The parallel search logic 441k may search the $(m+k)^{th}$ bit of the read vector RV to determine whether it is erroneous.

An output $\Lambda m$ of the parallel search logic 441m may be obtained by substituting $\alpha^{-(c-2m)}$ into the error location polynomial $\Lambda(x)$. The parallel search logic 441m may search the $2m^{th}$ bit of the read vector RV to determine whether it is erroneous.

As described above, during the first cycle, the $1^{st}$, $j^{th}$, $k^{th}$, and $m^{th}$ bits from an end of a data portion of the read vector RV may be searched to determine whether there are errors in these bits of the read vector RV. During the second cycle, the $(m+1)^{th}$, $(m+j)^{th}$, $(m+k)^{th}$ and $2m^{th}$ bits from an end of a data portion of the read vector RV may be searched to determine whether there are errors in these bits of the read vector RV.

Half Search Mode

When the chien search unit operates in a half search mode, the quarter multiplexers MQ1 to MQn and the half multiplexers MH1 to MHn in the parallel search logic 441j may select outputs of the coefficient multiplexers MC1 to MCn. The full multiplexers MF1 to MFn in the parallel search logic 441m may output zero values. If the full multiplexers MF1 to MFn in the parallel search logic 441m output zero values, the parallel search multipliers in the parallel search logic 441m may output zero values. That is, the parallel search logic 441m may be inactivated. As the parallel search logic 441m is inactivated, power consumption of the chien search unit 440 may be minimized.

When the chien search unit 440 operates in the half search mode, the multiplexers M1 to Mn may select outputs of the parallel search multipliers X1k to Xnk in the parallel search logic 441k.

At the first cycle, the coefficient multiplexers MC1 to MCn may select outputs of multipliers X1k to Xnk. Outputs of the first cycle at the half search mode may be identical to those at the full search mode except that the parallel search logic 441m is inactivated. At the first cycle, outputs $\Lambda 1$, $\Lambda j$, $\Lambda k$, and $\Lambda m$ of the parallel search logics 441 to 441m may be illustrated in the following table 3.

TABLE 3

| $\Lambda 1(441)$ | $\Lambda 1 = \Lambda_1 \alpha^{-c}\alpha + \Lambda_2 \alpha^{-2c}\alpha^2 + \ldots + \Lambda_n \alpha^{-nc}\alpha^n$ |
|---|---|
|  | $= \Lambda_1 \alpha^{-(c-1)} + \Lambda_2 \alpha^{-2(c-1)} + \ldots + \Lambda_n \alpha^{-n(c-1)}$ |

TABLE 3-continued

| | |
|---|---|
| $\wedge j(441j)$ | $\wedge i = \wedge_1 \alpha^{-c}\alpha^j + \wedge_2 \alpha^{-2c}\alpha^{2j} + \ldots + \wedge_n \alpha^{-nc}\alpha^{nj}$ |
| | $= \wedge_1 \alpha^{-(c-j)} + \wedge_2 \alpha^{-2(c-j)} + \ldots + \wedge_n \alpha^{-n(c-j)}$ |
| $\wedge k(441k)$ | $\wedge j = \wedge_1 \alpha^{-c}\alpha^k + \wedge_2 \alpha^{-2c}\alpha^{2k} + \ldots + \wedge_n \alpha^{-nc}\alpha^{nk}$ |
| | $= \wedge_1 \alpha^{-(c-k)} + \wedge_2 \alpha^{-2(c-k)} + \ldots + \wedge_n \alpha^{-n(c-k)}$ |
| $\wedge m(441m)$ | 0 |

During the first cycle of the half search mode, the chien search unit 440 may search errors of the $1^{st}$, $j^{th}$, $k^{th}$, and $m^{th}$ bits from an end of a data portion of the read vector RV (e.g., the read data vector RDV of the read vector RV illustrated in FIG. 4).

At the second cycle, the coefficient multiplexers MC1 to MCn may select outputs of the delays D1 to Dn. That is, outputs of the parallel search registers R1$k$ to Rn$k$ in the parallel search logic 441$k$ may be multiplied with outputs of the parallel search multipliers X1$k$ to Xn$k$, respectively, in the parallel search logic 441$k$ at the first cycle. At this time, outputs $\wedge 1$, $\wedge j$, $\wedge k$, and $\wedge m$ of the chien search unit 440 may be illustrated in the following table 4.

TABLE 4

| | |
|---|---|
| $\wedge 1(441)$ | $\wedge 1 = \wedge_1 \alpha^{-(c-k)}\alpha + \wedge_2 \alpha^{-2(c-k)}\alpha^2 + \ldots + \wedge_n \alpha^{-n(c-k)}\alpha^n$ |
| | $= \wedge_1 \alpha^{-(c-k-1)} + \wedge_2 \alpha^{-2(c-k-1)} + \ldots + \wedge_n \alpha^{-n(c-k-1)}$ |
| $\wedge j(441j)$ | $\wedge i = \wedge_1 \alpha^{-(c-k)}\alpha^j + \wedge_2 \alpha^{-2(c-k)}\alpha^{2j} + \ldots + \wedge_n \alpha^{-n(c-k)}\alpha^{nj}$ |
| | $= \wedge_1 \alpha^{-(c-k-j)} + \wedge_2 \alpha^{-2(c-k-j)} + \ldots + \wedge_n \alpha^{-n(c-k-j)}$ |
| $\wedge k(441k)$ | $\wedge j = \wedge_1 \alpha^{-(c-k)}\alpha^k + \wedge_2 \alpha^{-2(c-k)}\alpha^{2k} + \ldots + \wedge_n \alpha^{-n(c-k)}\alpha^{nk}$ |
| | $= \wedge_1 \alpha^{-(c-2k)} + \wedge_2 \alpha^{-2(c-2k)} + \ldots + \wedge_n \alpha^{-n(c-2k)}$ |
| $\wedge m(441m)$ | 0 |

An output $\wedge 1$ of the parallel search logic 441 may be obtained by substituting $\alpha^{-(c-k-1)}$ into the error location polynomial $\wedge (x)$. The parallel search logic 441 may search the $(k+1)^{th}$ bit of the read vector RV to determine whether it is erroneous.

An output $\wedge j$ of the parallel search logic 441$j$ may be obtained by substituting $\alpha^{-(c-k-j)}$ into the error location polynomial $\wedge (x)$. The parallel search logic 441$j$ may search the $(k+j)^{th}$ bit of the read vector RV to determine whether it is erroneous.

An output $\wedge k$ of the parallel search logic 441$k$ may be obtained by substituting $\alpha^{-(c-2k)}$ into the error location polynomial $\wedge (x)$. The parallel search logic 441$k$ may search the $2k^{th}$ bit of the read vector RV to determine whether it is erroneous.

As described above, during the first cycle, whether the $1^{st}$, $j^{th}$, and $k^{th}$ bits from an end of a data portion of the read vector RV are erroneous may be searched. During the second cycle, the $(m+1)^{th}$, $(k+j)^{th}$, and $2k^{th}$ bits from an end of a data portion of the read vector RV may be searched to determine whether they are erroneous. That is, when operating in the half search mode, the chien search unit 440 may search k bits at the same time.

In exemplary embodiments of the present general inventive concept, one or more parallel search logics can be provided between the parallel search logics 441$k$ and 441$m$. When the parallel search logic 441$m$ is inactivated, one or more parallel search logics between the parallel search logics 441$k$ and 441$m$ may be inactivated.

In exemplary embodiments of the present general inventive concept, the search capacity may be one half of that of the search capacity of a full search mode. That is, as compared with the full search mode, a search capacity of the half search mode may be halved. The number of bits of a data portion of read vector simultaneously searched during a cycle by the chien search unit 440 when operating in a half search mode may be one half the number of bits of a data portion of read vector simultaneously searched during a cycle of the chien search unit 440 operating in a full search mode.

The number of parallel search logics activated when the chien search unit 440 is operating in the half search mode may be less than the number of parallel search logics activated when the chien search unit 440 is operating in the full search mode. Accordingly, cycle-per-power consumption of the half search mode may be less than that of the full search mode.

Quarter Search Mode

When the chien search unit 440 is operating in a quarter search mode, the quarter multiplexers MQ1 to MQn in the parallel search logic 441$j$ may select outputs of the coefficient multiplexers MC1 to MCn. The half multiplexers MH1 to MHn in the parallel search logic 441$k$ and the full multiplexer MF1 to MFn in the parallel search logic 441$m$ may output zero values. If the half multiplexers MH1 to MHn in the parallel search logic 441$k$ and the full multiplexer MF1 to MFn in the parallel search logic 441$m$ may output zero values output zero values, the parallel search multipliers X1$k$ to Xn$k$ and X1$m$ to Xn$m$ in the parallel search logics 441$k$ and 441$m$ may output zero values. That is, the parallel search logics 441$k$ and 441$m$ may be inactivated. As the parallel search logics 441$k$ and 441$m$ are inactivated, power consumption by the chien search unit 440 may be minimized.

When the chien search unit 440 is operating in the quarter search mode, the multiplexers M1 to Mn may select outputs of the parallel search multipliers X1$j$ to Xn$j$ in the parallel search logic 441$j$.

At the first cycle, the coefficient multiplexers MC1 to MCn may select outputs of multipliers (e.g., multipliers X1$j$ to Xn$j$). Outputs of the first cycle at the quarter search mode may be identical to those at the full search mode except that the parallel search logics 441$k$ and 441$m$ are inactivated. At the first cycle, outputs $\wedge 1$, $\wedge j$, $\wedge k$, and $\wedge m$ of the parallel search logics 441 to 441$m$ may be illustrated in the following table 5.

TABLE 5

| | |
|---|---|
| $\wedge 1(441)$ | $\wedge 1 = \wedge_1 \alpha^{-c}\alpha + \wedge_2 \alpha^{-2c}\alpha^2 + \ldots + \wedge_n \alpha^{-nc}\alpha^n$ |
| | $= \wedge_1 \alpha^{-(c-1)} + \wedge_2 \alpha^{-2(c-1)} + \ldots + \wedge_n \alpha^{-n(c-1)}$ |
| $\wedge j(441j)$ | $\wedge i = \wedge_1 \alpha^{-c}\alpha^j + \wedge_2 \alpha^{-2c}\alpha^{2j} + \ldots + \wedge_n \alpha^{-nc}\alpha^{nj}$ |
| | $= \wedge_1 \alpha^{-(c-j)} + \wedge_2 \alpha^{-2(c-j)} + \ldots + \wedge_n \alpha^{-n(c-j)}$ |
| $\wedge k(441k)$ | 0 |
| $\wedge m(441m)$ | 0 |

During the first cycle of the quarter search mode, the chien search unit 440 may search errors of the $1^{st}$ and $j^{th}$ bits from an end of a data portion of the read vector RV (e.g., the read data vector RDV of the read vector RV illustrated in FIG. 4).

At the second cycle, the coefficient multiplexers MC1 to MCn may select outputs of the delays D1 to Dn. That is, outputs of the parallel search registers R1j to Rnj in the parallel search logic 441j may be multiplied with outputs of the parallel search multipliers X1j to Xnj in the parallel search logic 441j at the first cycle. At this time, outputs $\Lambda 1$, $\Lambda j$, $\Lambda k$, and $\Lambda m$ of the chien search unit 440 may be illustrated in the following table 6.

TABLE 6

| | |
|---|---|
| $\Lambda 1(441)$ | $\Lambda 1 = \Lambda_1 \alpha^{-(c-j)}\alpha + \Lambda_2 \alpha^{-2(c-j)}\alpha^2 + \ldots + \Lambda_n \alpha^{-n(c-j)}\alpha^n$ |
| | $= \Lambda_1 \alpha^{-(c-j-1)} + \Lambda_2 \alpha^{-2(c-j-1)} + \ldots + \Lambda_n \alpha^{-n(c-j-1)}$ |
| $\Lambda j(441j)$ | $\Lambda i = \Lambda_1 \alpha^{-(c-j)}\alpha^j + \Lambda_2 \alpha^{-2(c-j)}\alpha^{2j} + \ldots + \Lambda_n \alpha^{-n(c-j)}\alpha^{nj}$ |
| | $= \Lambda_1 \alpha^{-(c-2j)} + \Lambda_2 \alpha^{-2(c-2j)} + \ldots + \Lambda_n \alpha^{-n(c-2j)}$ |
| $\Lambda k(441k)$ | 0 |
| $\Lambda m(441m)$ | 0 |

An output $\Lambda 1$ of the parallel search logic 441 may be obtained by substituting $\alpha^{-(c-j-1)}$ into the error location polynomial $\Lambda(x)$. The parallel search logic 441 may search whether the $(j+1)^{th}$ bit of the read vector RV is erroneous.

An output $\Lambda j$ of the parallel search logic 441j may be obtained by substituting $\alpha^{-(c-2j)}$ into the error location polynomial $\Lambda(x)$. The parallel search logic 441j may search whether the $2j^{th}$ bit of the read vector RV is erroneous.

As described above, during the first cycle, the $1^{st}$ and $j^{th}$ bits from an end of a data side of the read vector RV may be searched to determine whether they are erroneous. During the second cycle, the $(j+1)^{th}$ and $2j^{th}$ bits from an end of a data side of the read vector RV may be searched to determine whether they are erroneous. That is, at the quarter search mode, the chien search unit 440 may search j bits at the same time.

In exemplary embodiments of the present general inventive concept, one or more parallel search logics can be provided between the parallel search logics 441j and 441k. When the parallel search logic 441k is inactivated, one or more parallel search logics between the parallel search logics 441j and 441k may be inactivated.

In exemplary embodiments of the present general inventive concept, a search capacity of the quarter search mode may be halved compared to the half search mode. The number of bits of a data portion of read vector simultaneously searched during a cycle by the chien search unit 440 when operating in a quarter search mode may be one quarter the number of bits of a data portion of read vector simultaneously searched during a cycle of the chien search unit 440 operating in a full search mode.

The number of parallel search logics activated at the quarter search mode may be less than that activated at the half search mode. Accordingly, cycle-per-power consumption of the chien search unit 440 operating in the quarter search mode may be less than that of the half search mode.

The number of bits to be searched concurrently by the chien search unit 440 may be adjusted according to the number of errors of the read vector RV. For example, the number of bits to be searched concurrently in the read vector RV may be adjusted by controlling the chien search unit 440 with, for example, the control unit 470 illustrated in FIG. 6, so as to operate in the full search mode, the half search mode, or the quarter search mode, or any other determined search mode desired. As the number of bits to be searched concurrently is adjusted by the chien search unit 440, cycle-per-power consumption may be adjusted.

Figure 11:
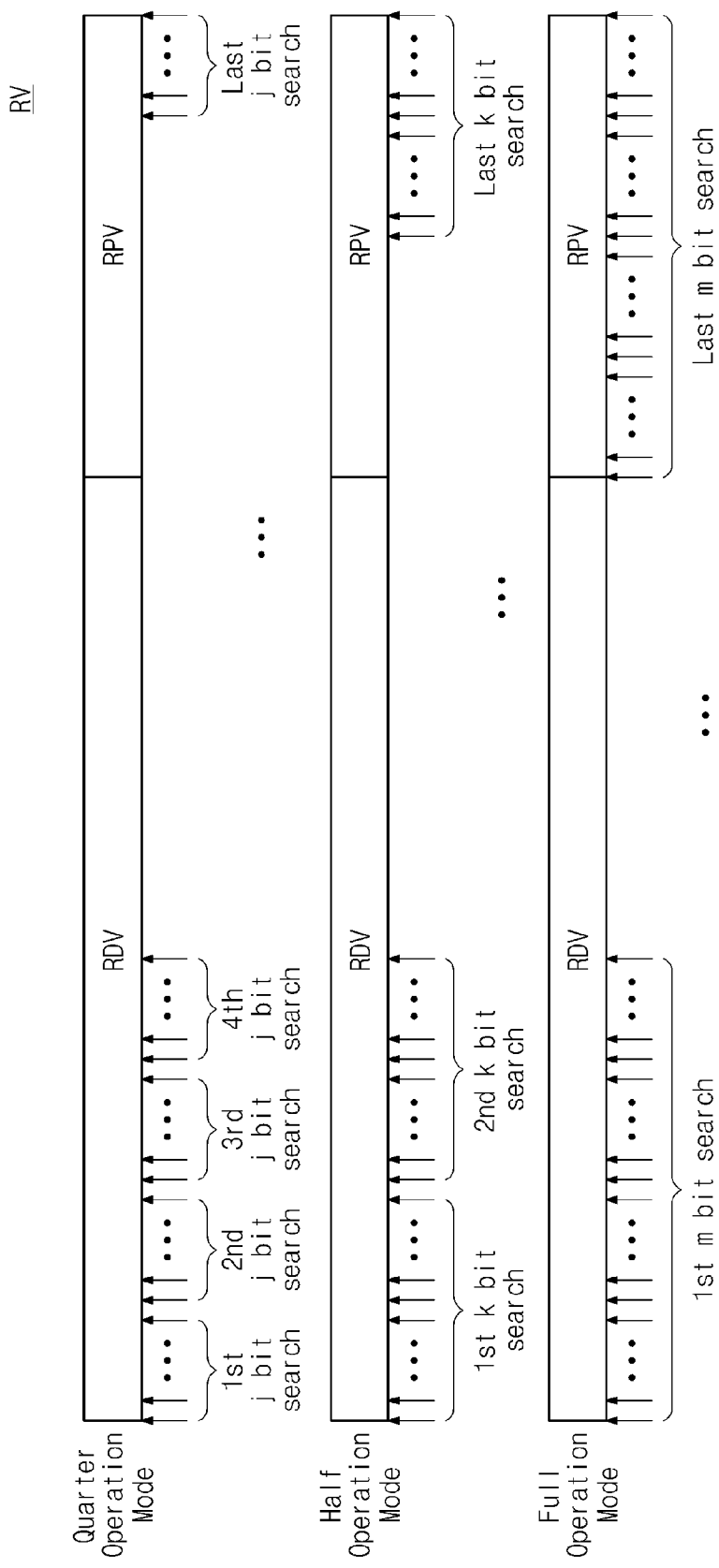
FIG. 11 is a diagram illustrating an operation of a chien search unit according to quarter, half, and full operation modes according to exemplary embodiments of the present general inventive concept.

FIG. 11 is a diagram illustrating an operation of a chien search unit according to quarter, half, and full operation modes. Referring to FIG. 11, when the chien search unit 440 operates in a quarter operation mode (i.e., a quarter search mode), a chien search may be executed by a j-bit unit from an end of a data portion of a read vector RV (e.g., the read data vector RDV portion of the read vector RV illustrated in FIGS. 4 and 11). When the chien search unit 440 operates in a half operation mode (i.e., a half search mode), chien search may be executed by a k-bit unit from an end of a data portion of the read vector RV. When the chien search unit 440 operates in a full operation mode (i.e., a full search mode), a chien search may be executed by an m-bit unit from an end of a data portion of the read vector RV.

A chien search unit 440 according to exemplary embodiments of the present general inventive concept may search an error from an end of a data portion of the read vector RV (e.g., the read data vector RDV portion of the read vector RV illustrated in FIGS. 4 and 11). That is, the chien search unit 440 may operate in a forward chien search manner. If the forward chien search is performed, error locations may be determined and corrected sequentially from an end of a data portion of the read vector RV.

Figure 12:
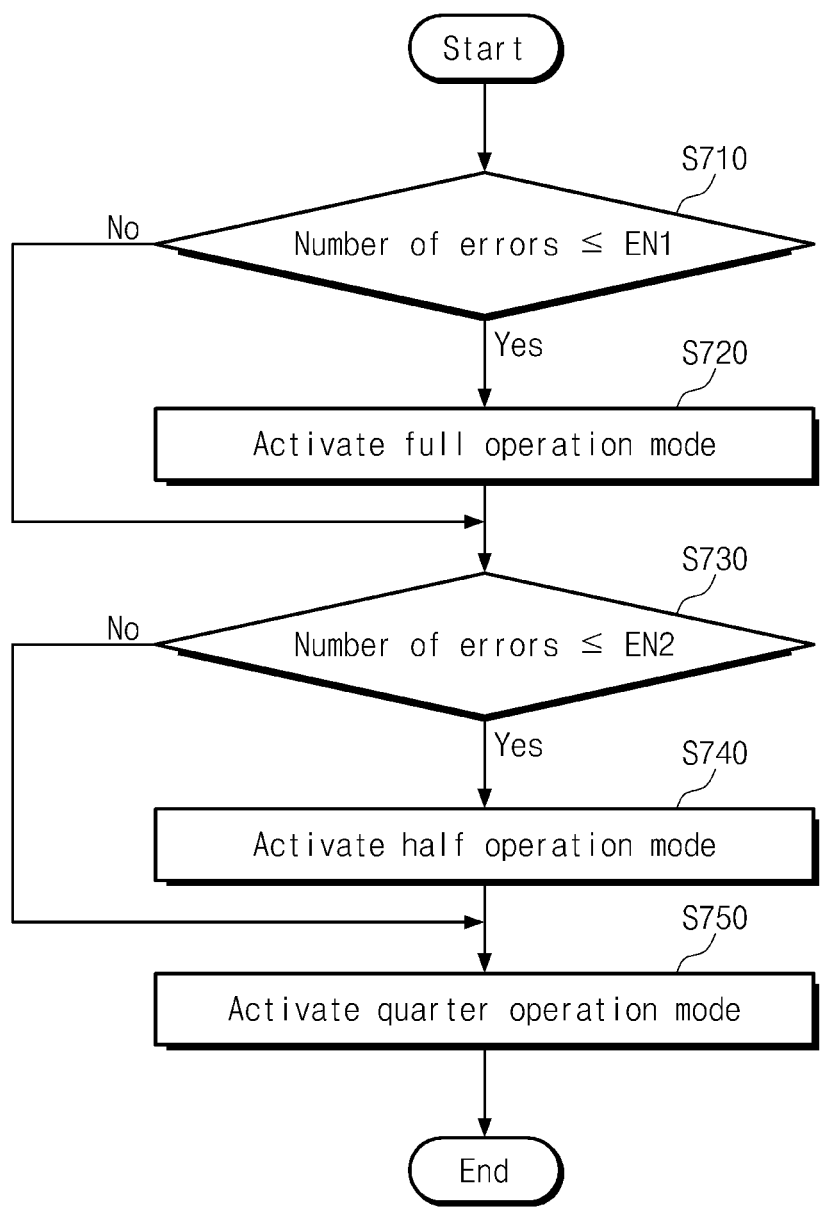
FIG. 12 is a flowchart illustrating a chien search operation mode determining method according to exemplary embodiments of the present general inventive concept.

FIG. 12 is a flowchart illustrating a chien search operation mode determining method according to exemplary embodiments of the present general inventive concept. Referring to FIGS. 6, 10, and 12, operation S710 determines whether the number of detected errors is below the first error number EN1. If the number of detected errors is below the first error number EN1, in operation S720, a full operation mode (or, a full search mode) may be activated. That is, the chien search unit 440 may operate in a full search mode. When the number of detected errors is below the first error number EN1, a control unit 470 may control quarter multiplexers MQ1 to MQn, half multiplexers MH1 to MHn, and full multiplexers MF1 to MFn of the chien search unit 44 so as to select outputs of coefficient multiplexers MC1 to MCn. Multiplexers M1 to Mn may select outputs of parallel search multipliers R1m to Rnm in parallel search logic 441m under the control of the control unit 470.

If the number of detected errors is greater than the first error number EN1, operation S730 may be performed, in which it is determined whether the number of detected errors is below the second error number EN2. If the number of detected errors is less than or equal to the second error number EN2, a half operation mode (or, a half search mode) may be activated in operation S740. That is, the chien search unit 440 may operate in a half search mode at operation S740. When the number of detected errors is less than or equal to the second error number EN2, the control unit 470 may control the quarter multiplexers MQ1 to MQn and the half multiplexers MH1 to MHn of the chien search unit 440 so as to select outputs of coefficient multiplexers MC1 to MCn and the full multiplexers MF1 to MFn so as to output zero values. The multiplexers M1 to Mn may select outputs of parallel search multipliers X1k to Xnk in parallel search logic 441k under the control of the control unit 470.

If the number of detected errors is greater than the second error number EN2, a quarter operation mode (or, a quarter search mode) may be performed at operation S750. The control unit 470 may control the quarter multiplexers MQ1 to MQn so as to select outputs of coefficient multiplexers MC1 to MCn and may control half multiplexers MH1 to MHn and the full multiplexers MF1 to MFn so as to output zero values. The multiplexers M1 to Mn may select outputs of parallel search multipliers X1j to Xnj in parallel search logic 441j under the control of the control unit 470.

In exemplary embodiments of the present general inventive concept, the second error number EN2 may be larger than (i.e., greater than) the first error number EN1. That is, as the number of errors in a read vector RV increases, the control unit 470 may reduce the number of parallel search logics to be activated in the chien search unit 440. As the number of errors in a read vector RV increases, cycle-per-power consumption of a chien search unit 440 may be reduced.

In exemplary embodiments of the present general inventive concept, the first error number EN1 may be one quarter of an error correction bit number of an ECC decoder 400 in FIGS. 1 and 6. The second error number EN1 may be one half an error correction bit number of the ECC decoder 400.

In operations S710 to S750, the full operation mode, the half operation mode, or the quarter operation mode may be selected according to the number of detected errors. Since the number of bits searched concurrently may be differentiated according to the full operation mode, the half operation mode, and the quarter operation mode, cycle-per-power consumption may be adjusted. The operations S710 to S750 may constitute part or all of operations S610 and S620 described with reference to FIG. 9.

Figure 13:
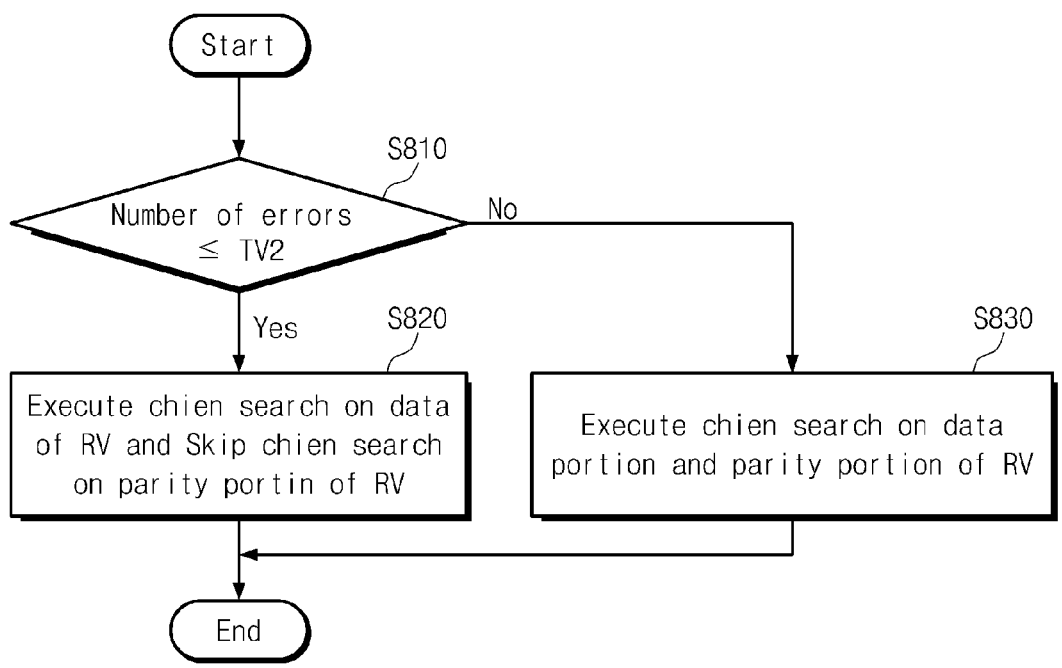
FIG. 13 is a flowchart illustrating a method of determining parity search at chien search according to exemplary embodiments of the present general inventive concept.

FIG. 13 is a flowchart illustrating a method of determining parity search at chien search according to exemplary embodiments of the present general inventive concept. That is, FIG. 13 illustrates a method of determining whether a parity information of a read vector (e.g., the read parity vector RPV of the read vector RV illustrated in FIG. 4) should be searched during a chien search of the read vector RV. The method may determine whether the read data portion of the read vector may be searched, or whether the read data and the parity data of the read vector may be searched. Referring to FIGS. 6 and 13, operation S810 may determine whether the number of detected and/or estimated errors is less than or equal to a second threshold value TV2. If the number of detected errors is less than or equal to the second threshold value TV2, a chien search on a data portion of a read vector RV may be executed and chien search on a parity portion thereof may be skipped in operation S820. If the number of detected errors is greater than the second threshold value TV2, a chien search on the data and parity portions of the read vector RV may be executed in operation S830. As illustrated in FIGS. 4 and 11, the read vector RV may include the read data vector RDV and read parity vector PRV portion. That is, when the number of errors of the read vector RV is less than or equal to the second threshold value, a chien search may be performed on the data portion of the read vector RV, and when the number of errors of the read vector is greater than the second threshold value, the chien search may be performed on both the data portion and the parity portion of the read vector RV.

When the number of detected errors is less than or equal to the second threshold value TV2 (e.g., as determined at operation S810 illustrated in FIG. 13 and described above), a control unit 470 may control the chien search unit 440 so as to perform a forward chien search on the data portion of the read vector RV. When the number of detected errors is greater than the second threshold value TV2, the control unit 470 may control the chien search unit 440 so as to perform chien search on data and parity portions of the read vector RV.

Figure 14:
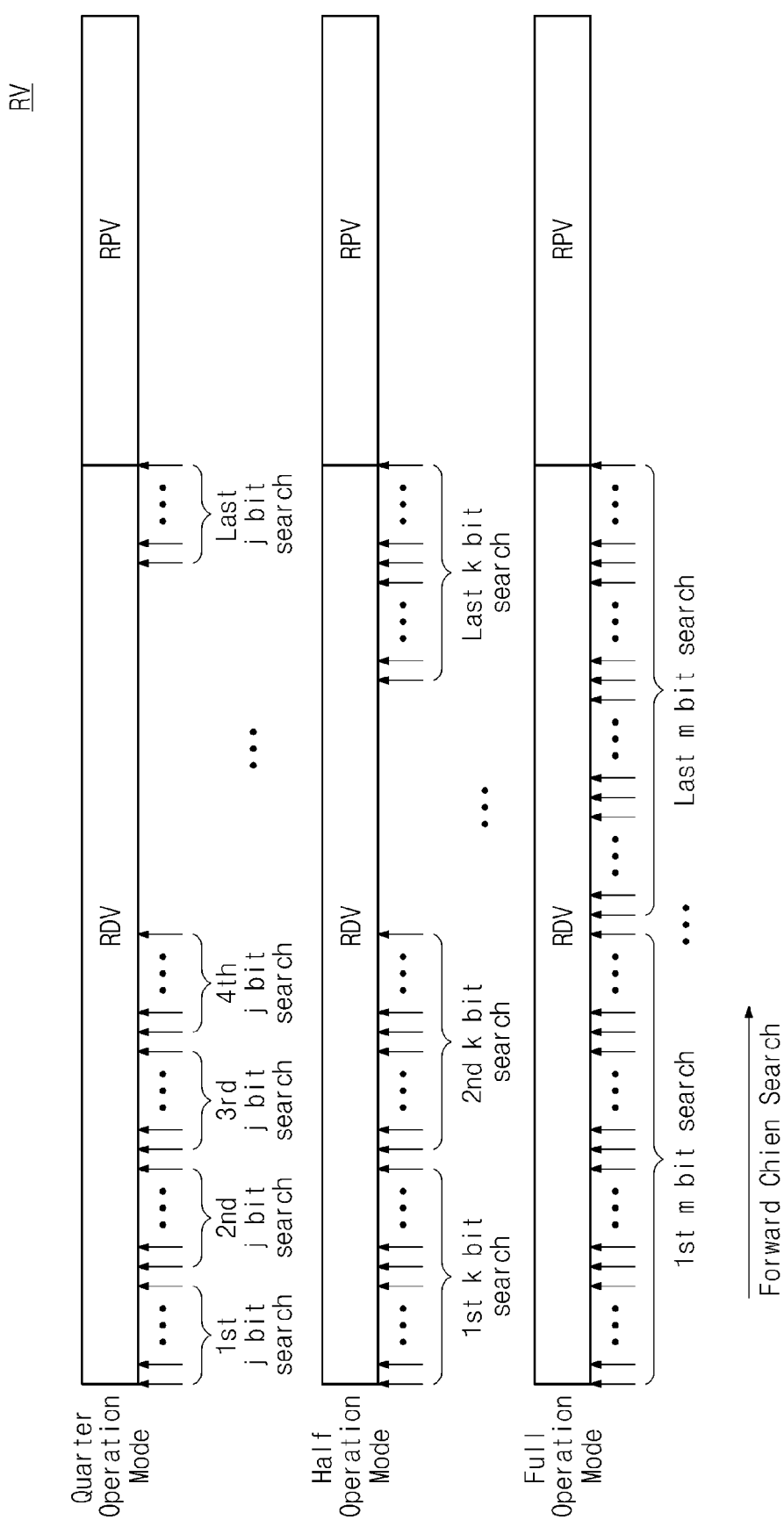
FIG. 14 is a diagram illustrating an operation of a chien search unit according to quarter, half, and full operation modes when chien search on a parity portion of a read vector RV is skipped according to exemplary embodiments of the present general inventive concept.

FIG. 11 illustrates performing a chien search on data (i.e., read data vector RDV) and parity portions (i.e., read parity vector RPV) of the read vector RV. FIG. 14 illustrates an operation of a chien search unit according to quarter, half, and full operation modes when chien search on a parity portion of a read vector RV is skipped (i.e., where the read data vector RDV is searched, and not the read parity vector RPV).

As compared with FIG. 11, a chien search on a parity portion of a read vector may not be performed, as illustrated in FIG. 14. For example, at quarter, half, and full operation modes, a chien search on a parity portion (i.e., the read parity vector RPV) of a read vector RV may be skipped.

When an index $\Lambda_n$ of the highest degree of an error location polynomial $\Lambda(x)$ is '0', the number of errors in a read vector RV may be identical to or less than (n−1), i.e., $\Lambda_{n-1}$ as described above in connection with FIG. 8. That is, when an index $\Lambda_n$ of the highest degree of the error location polynomial $\Lambda(x)$ is '0', an error-corrected read data vector may be obtained from the read vector RV, although a chien search is performed on a data portion of the read vector RV, and not the parity portion of the read vector RV.

When an index $\Lambda_n$ of the highest degree of the error location polynomial $\Lambda(x)$ is non-zero, the number of errors in the read vector RV may be identical to or more than n (where n is a variable discussed in connection with FIG. 8 above). A chien search on the read vector RV may be performed, and, in exemplary embodiments of the present general inventive concept, additional error detecting and correcting operations may be performed.

When an index $\Lambda_n$ of the highest degree of the error location polynomial $\Lambda(x)$ is '0', that is, when error is capable of being corrected by error search of a data portion of the read vector RV executed via the chien search, the chien search on a parity portion of the read vector RV may be skipped. A power consumed at chien search and a time taken to execute the chien search may be reduced by skipping chien search on a parity portion of the read vector RV. The index $\Lambda_n$ of the highest degree of the error location polynomial $\Lambda(x)$ may be used to determine whether to skip a chien search of the read parity vector RPV of the read vector RV. That is, in exemplary embodiments of the present general inventive concept, the index $\Lambda_n$ of the highest degree of the error location polynomial $\Lambda(x)$ may determine whether to perform a chien search as illustrated in FIG. 11, where both the read data vector RDV and the parity data vector RPV of the read vector RV are searched, or whether to perform a chien search as illustrated in FIG. 14, where only the read data vector RDV of the read vector RV is searched.

A margin may be provided to improve the reliability of an ECC decoder 400. For example, the second threshold value TV2 may be set to 3. That is, when indexes $\Lambda_n$, $\Lambda_{n-1}$, and $\Lambda_{n-2}$ of three uppermost terms of an error location polynomial $\Lambda(x)$ is '0', a chien search on a parity portion of the read vector RV may be skipped. The second threshold value TV2 is not limited to 3, and any suitable threshold number may be selected in order to carry out the exemplary embodiments of the present general inventive concept disclosed herein. The second threshold value TV2 may be changed according to various conditions such as a structure of the ECC decoder 400, the reliability thereof, and the like.

Figure 15:
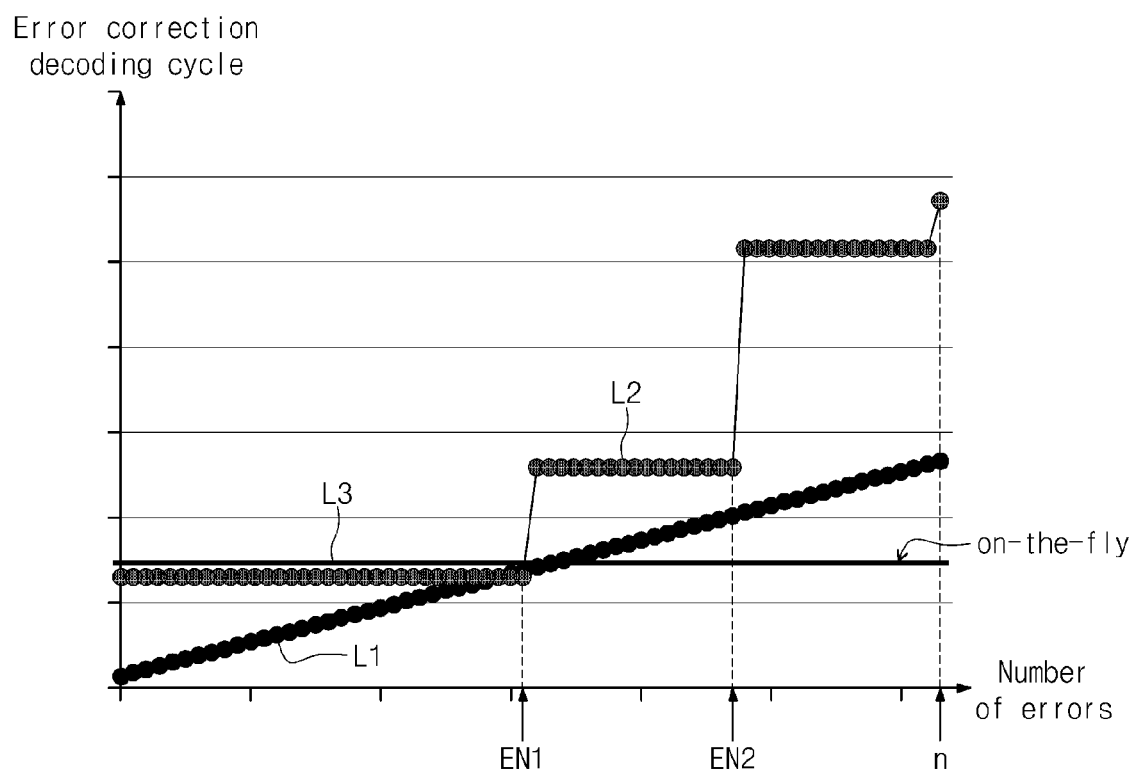
FIGS. 15 and 15A are diagrams illustrating an error correction decoding cycle according to the number of errors in exemplary embodiments of the present general inventive concept.
Figure 15A:
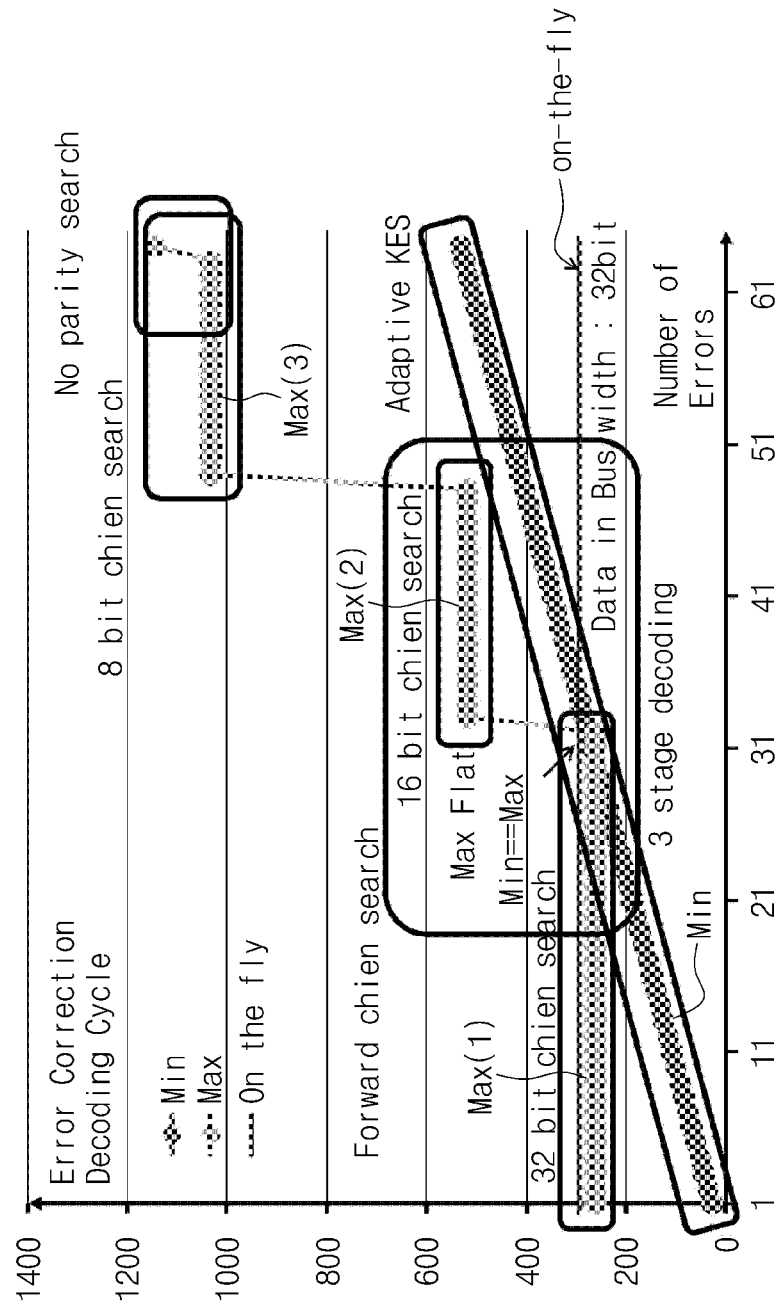

FIGS. 15 and 15A are diagrams illustrating an error correction decoding cycle according to the number of errors in exemplary embodiments of the present general inventive concept. In both FIGS. 15 and 15A, a horizontal axis may indicate the number of errors of a read vector RV, and a vertical axis may indicate an error correction decoding cycle. A variable n as illustrated in FIG. 15 may correspond to the maximum error correction bit number of an ECC decoder 400.

The first line L1 may illustrate the number of cycles to calculate an error location polynomial $\Lambda(x)$. As described with reference to FIG. 8, calculation of the error location polynomial $\Lambda(x)$ may be performed iteratively and may be ended when a specific condition is satisfied. For example, as illustrated in FIG. 8, the calculation of the error location polynomial Λ (x) may end when a zero count (i.e., the number of times Λ$_n$ is zero) is greater than or equal to a threshold value. The cycles to perform a calculation of the error location polynomial Λ (x) may increase according to an increase in the number of errors of the read vector RV, as illustrated by first line L1 of FIG. 15, as well as the "Min" line of FIG. 15A, which illustrate a linear relationship between the number of errors and the number of error correction decoding cycles.

The second line L2 may illustrate a number of cycles to perform a chien search. In exemplary embodiments of the present general inventive concept, when the number of errors of the read vector RV is below the first error number EN1 (e.g., n/4, where n is the maximum error correction bit number of the ECC decoder 400; see Table 7 below), a chien search may be performed with the chien search unit 440 in a full operation mode (or, a full search mode). When the number of errors of the read vector RV is greater than the first error number EN1 (e.g., n/4 as illustrated in Table 7 below) and below the second error number EN2 (e.g., n/2, as illustrated in Table 7 below), a chien search may be performed with the chien search unit 440 operating in a half operation mode (or, a half search mode). When the number of errors of the read vector RV is greater than the second error number EN2 (e.g., n/2) and below n (i.e., the maximum error correction bit number of the ECC decoder 400), a chien search may be performed by the chien search unit 440 operating in a quarter operation mode (or, a quarter search mode). As the number of errors of the read vector RV increases, the number of cycles to perform a chien search may also increase.

As illustrated in FIG. 15A, when the number of errors of the read vector RV is below the first error number EN1 described above (e.g., the number 32, as illustrated in FIG. 15A), a chien search may be performed with the chien search unit 440 in a full operation mode (or, a full search mode). For example, a 32 bit chien search may be performed, as illustrated by the "Max(1)" line illustrated in FIG. 15A. When the number of errors of the read vector RV is greater than the first error number EN1 (e.g., the number 32 as illustrated in FIG. 15A) and below the second error number EN2 (e.g., the number 48 as illustrated in FIG. 15A), a chien search may be performed with the chien search unit 440 operating in a half operation mode (or, a half search mode) as illustrated by the "Max(2)" line in FIG. 15A. As a half search mode is selected, a 16 bit chien search (i.e., where 16 bits is one half of the 32 bit full search illustrated and described in connection with the "Max(1)" line) may be performed. When the number of errors of the read vector RV is greater than the second error number EN2 (e.g., the number 48 as illustrated in FIG. 15A) and below n (i.e., the maximum error correction bit number of the ECC decoder 400, which is the number 64 as illustrated in FIG. 15A), a chien search may be performed by the chien search unit 440 operating in a quarter operation mode (or, a quarter search mode). That is, an 8 bit chien search may be performed by the chien search unit 440 operating in the quarter operation mode (i.e., where 8 bits is one quarter of the 32 bit search of the full operation mode). As the number of errors of the read vector RV increases, the number of cycles to perform a chien search may also increase. That is, as illustrated in FIG. 15A, the number of error correction decoding cycles increases between the "Max(1)" to "Max(3)" lines.

The third line L3 illustrated in FIG. 15 may illustrate data input/output cycles of a controller 200. When the number of errors of the read vector RV is less than the first error number EN1 (e.g., n/4, as illustrated in Table 7 below; and where EN1 is the number 32 as illustrated in FIG. 15A), the calculation cycles of the error location polynomial Λ (x) and chien search cycles may be set to be less than data input/output cycles.

When the number of errors of the read vector RV is greater than the first error number EN1 (e.g., n/4, as illustrated in Table 7 below; and where EN1 is the number 32 as illustrated in FIG. 15A), the calculation cycles of the error location polynomial Λ (x) and chien search cycles may be set to be more than data input/output cycles.

Figure 16:
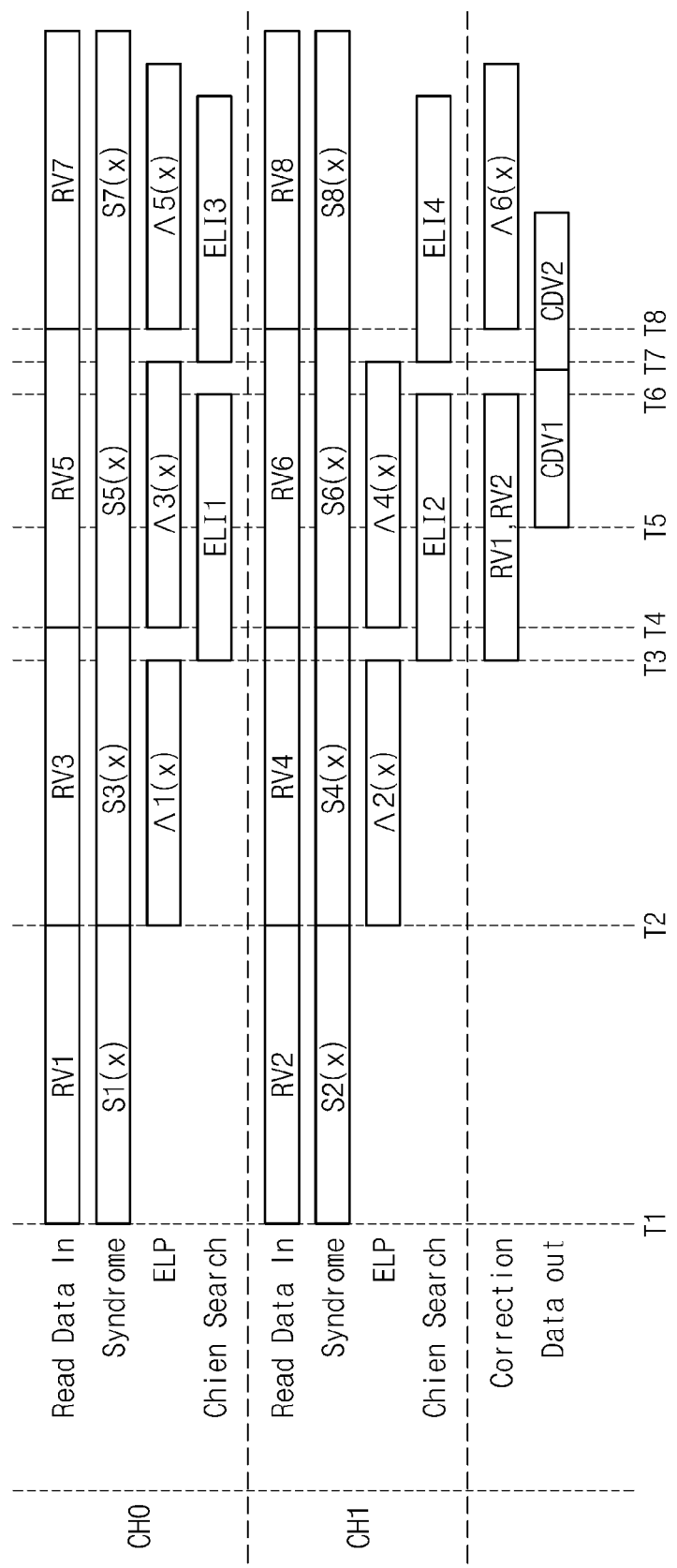
FIG. 16 is a timing diagram illustrating an error correction decoding operation according to exemplary embodiments of the present general inventive concept.

For example, when the number of errors of the read vector RV is below the first error number EN1 (e.g., n/4, as illustrated in Table 7 below; and where EN1 and the number 32 as illustrated in FIG. 15A), a KES unit 430 may operate such that calculation cycles of the error location polynomial Λ (x) is set to be identical to or less than data input/output cycles. A calculation speed of the error location polynomial Λ (x) may be identical to or faster than a data input/output speed. That is, when the number of errors of the read vector RV is below the first error number EN1 (e.g., n/4), an "on-the-fly" mode (illustrated in FIGS. 15 and 15A by the "on-the-fly" line) may be supported such that an error correction speed is tied to a calculation speed of the error location polynomial Λ (x), as discussed in detail below in connection with FIG. 16. That is, "on-the-fly" refers to when an error correction of a read vector can occur where there are no delays in calculating a syndrome S(x), calculating an error location polynomial, and performing a chien search before the read vector can be error corrected and the error corrected data vector CDV can be output from the controller 200. As illustrated in FIG. 16, in the on-the-fly mode, error correction of the read vector is performed immediately following the calculation of the error location polynomial, without delay.

When the number of errors of the read vector RV is greater than the first error number EN1 (e.g., n/4, as illustrated in Table 7 below; and where EN1 is the number 32 as illustrated in FIG. 15A), the KES unit 430 may increase the number of operation cycles relative to the number of data input/output cycles. If the KES unit 430 supports the on-the-fly mode when the number of errors of the read vector RV is below the first error number EN1 (e.g., n/4, as illustrated in Table 7 below; and where EN1 is the number 32 as illustrated in FIG. 15A), a gate count of the KES unit 430 may be reduced.

For example, when the number of errors of the read vector RV is below the first error number EN1 (e.g., n/4, as illustrated in Table 7 below; and where EN1 is the number 32 as illustrated in FIG. 15A), a chien search unit 440 may operate in a full operation mode (or, a full search mode as illustrated by the "Max(1)" line illustrated in FIG. 15A). In the full operation mode, the chien search unit 440 may operate such that the number of cycles to perform a chien search is to the same as (i.e., equal to, where Min=Max as illustrated in FIG. 15A) or less than the number of data input/output cycles. At this time, a chien search speed may be to the same as, faster, or slower than a data input/output speed. That is, when the number of errors of the read vector RV is less than the first error number EN1 (e.g., n/4; see Table 7 below), the on-the-fly mode may be supported such that an error correction speed is tied to a calculation speed of the error location polynomial Λ (x). In exemplary embodiments of the present general inventive concept, the error correction may be correlated with the calculation of the error location polynomial Λ (x), where the error correction may be performed following the calculation of the error location polynomial Λ (x).

When the number of errors of the read vector RV is greater than the first error number EN1 (e.g., n/4, as illustrated in Table 7 below; and where EN1 is the number 32 as illustrated in FIG. 15A) and less than the second error number EN2 (e.g., n/2, as illustrated in Table 7 below; and where EN2 is the number 48 as illustrated in FIG. 15A), the chien search unit 440 may execute chien search in the half operation mode. As illustrated by line "Max(2)" in FIG. 15A, a 16 bit chien search may be performed by the chien search unit 440. When the number of errors of the read vector RV is greater than the second error number EN2 (e.g., n/2 as illustrated in Table 7 below; and where EN2 is the number 48 as illustrated in FIG. 15A) and below n (e.g., where n is the maximum error correction bit number of the ECC decoder 400, and is the number 64 as illustrated in FIG. 15A; see Table 7 below), the chien search unit 440 may execute the chien search in the quarter operation mode. As illustrated in FIG. 15A, the chien search unit 440 may operate in a quarter operation mode to perform an 8 bit chien search as illustrated by line Max(3). That is, cycle-per-power consumption of the chien search unit 440 may be reduced sequentially as the number of errors of the read vector RV exceeds threshold values.

Chien search on a parity portion of the read vector RV (e.g., the read parity vector RPV of the read vector RV) may be skipped according to the number of errors of the read vector RV. When the number of errors of the read vector RV is below the first error number EN1 (e.g., n/4 as illustrated in Table 7 below; and where EN1 is the number 32 as illustrated in FIG. 15A), a chien search of a full operation mode may be executed, and a chien search on a parity portion of the read vector RV may be skipped. The number of cycles for a chien search may be less than that of data input/output cycles. That is, when the number of errors of the read vector RV is below the first error number EN1, the chien search unit 440 may be operated in a full search mode to search the read data vector RDV portion of the read vector, and may skip searching the read parity portion RPV of the read vector RV.

When the number of errors of the read vector RV is greater than the first error number EN1 (e.g., n/2 as illustrated in Table 7 below; and where EN1 is the number 32 as illustrated in FIG. 15A) and less than the second error number EN2 (e.g., n/2 as illustrated in Table 7 below; and EN2 is the number 48 as illustrated in FIG. 15A), a chien search may be performed with the chien search unit 440 operating in a half operation mode (e.g., a 16 bit search as illustrated in FIG. 15A), and the chien search on a parity portion of the read vector RV may be skipped. When the number of errors of the read vector RV is greater than the second error number EN2 (e.g., n/2 as illustrated in Table 7 below; and where EN2 is the number 32 as illustrated in FIG. 15A) and less than the second threshold value TV2, a chien search may be performed with the chien search unit 440 operating in a quarter operation mode (e.g., an 8 bit search as illustrated in FIG. 15A), and a chien search on a parity portion of the read vector RV may be skipped.

When the number of errors of the read vector RV is over the second error number EN2 (e.g., n/2, as illustrated in Table 7 below; and where EN2 is the number 32 as illustrated in FIG. 15A), a chien search may be performed with the chien search unit 440 operating in a quarter operation mode to search data and parity portions of the read vector RV. Although a chien search performed when the chien search unit 440 is in the quarter operation mode may be performed identically (i.e., the chien search may be performed identically for each of the determined number of cycles, regardless of the number of cycles determined), the number of cycles to perform a chien search may be determined according to whether the number of errors of the read vector RV is below the second error number EN2 (e.g., n/2 as illustrated in Table 7 below; and where EN2 is the number 48 as illustrated in FIG. 15A). For example, a cycle difference may be produced according to chien search on a parity portion of the read vector RV.

FIG. 16 is a timing diagram illustrating an error correction decoding operation according to exemplary embodiments of the present general inventive concept. In exemplary embodiments, the number of errors of a read vector RV may be below the first error number EN1 (e.g., n/4). That is, a KES unit 430 and a chien search unit 440 may support an on-the-fly mode, where a read vector can be error corrected, without delay, when a error location polynomial has been determined, so that an error corrected data vector CDV may be output from the ECC decoder 400. Referring to FIGS. 6 and 16, at T1, a first read vector RV1 may be received from a channel CH0, and a second read vector RV2 may be received from a channel CH1.

In exemplary embodiments of the present general inventive concept, the channels CH0 and CH1 may be independent from each other. The channels CH0 and CH1 may be connected to different memory devices. An ECC decoder 400 may be provided to be independent from the channels CH0 and CH1. Below, the ECC decoder 400 and its constituent elements may be described using the same reference numerals regardless of the channels CH0 and CH1.

A syndrome $S(x)$ may be calculated by multiplying a read vector RV and a parity check matrix $H^T$. The syndrome $S(x)$ may be calculated in the same manner as illustrated in, for example, FIG. 7 and described in detail above. Accordingly, the calculation of the syndrome $S(x)$ may be executed when the read vector RV is received. A syndrome calculation unit 420 corresponding to the channel CH0 may calculate the first syndrome $S1(x)$ of the first read vector RV1. A syndrome calculation unit 420 corresponding to the channel CH1 may calculate the second syndrome $S2(x)$ of the second read vector RV2.

At T2, inputs of the first and second read vectors RV1 and RV2 may be ended (i.e., the reception of the data and parity portions of these vectors may be complete). That is, at T2, the first and second read vectors RV1 and RV2, which may include read data vectors and read parity vectors, may be received in their entirety by the ECC decoder 400 of the controller 200. The syndromes $S1(x)$ and $S2(x)$ may be calculated by syndrome calculation units similar to the syndrome calculation unit 420 by the method illustrated in FIG. 7 and described in detail above. Calculation of the first and second syndromes $S1(x)$ and $S2(x)$ may be ended and/or completed when inputs of the first and second read vectors RV1 and RV2 are ended. As illustrated in FIG. 16, while the read vector RV1 is being received, the syndrome $S1(x)$ may be calculated during the same time period. Similarly, the read vector RV2 may be received, and the syndrome $S2(x)$ may be calculated during the same time period. The first and second syndromes $S1(x)$ and $S2(x)$ may be transferred to a KES unit 430. The KES unit 430 may calculate the first and second error location polynomials $\wedge 1(x)$ and $\wedge 2(x)$ based upon the first and second syndromes $S1(x)$ and $S2(x)$. The KES unit 430 may calculate the first and second error location polynomials $\wedge 1(x)$ and $\wedge 2(x)$ according to the method illustrated in FIG. 8 and described in detail above.

The channels CH0 and CH1 and the syndrome calculation unit 420 may enter into a ready state. That is, as the syndromes $S1(x)$ and $S2(x)$ and error location polynomials $\wedge 1(x)$ and $\wedge 2(x)$ have been respectively calculated for channels CH0 and CH1, the channels may be ready for a chien search to be performed (e.g., the error location polynomials $\wedge 1(x)$ and $\wedge 2(x)$ may be ready to be transferred to a chien search unit). At T2, the third read vector RV3 may be received via the channel CH0, and the fourth read vector RV4 may be received via the channel CH1. The syndrome calculation unit 420 may calculate the third and fourth syndromes $S3(x)$ and $S4(x)$ from the third and fourth read vectors RV3 and RV4 by the method illustrated in FIG. 7 and described in detail above.

When the number of errors of the first and second read vectors RV1 and RV2 is below the first error number EN1 (e.g., n/4), the number of cycles of an error location polynomial Λ (x) may be less than that of data input/output cycles. At T3, before inputs of the third and fourth read vectors RV3 and RV4 are ended (i.e., the reception of input vectors RV3 and RV4 is complete), calculation of the first and second error location polynomials Λ 1(x) and Λ 2(x) may be ended and/or completed. The first and second error location polynomials Λ 1(x) and Λ 2(x) may be transferred to a chien search unit 440.

The chien search unit 440 may execute chien search based upon the first and second error location polynomials Λ 1(x) and Λ 2(x). The chien search unit 440 may perform a chien search of the first and second error location polynomials Λ 1(x) and Λ 2(x) according to the method illustrated in FIG. 9 and described in detail above. A forward chien search may be performed sequentially from an end of a data portion of a read vector RV (e.g., the read data vector RDV of the read vector RV). According to the chien search result, an error may be detected and corrected sequentially from an end of a data portion of the read vector RV. That is, error correction may be executed at the chien search at T3.

The KES unit 420 may enter into a ready state at T4.

At T4, inputs of the third and fourth read vectors RV3 and RV4 may be completed, and calculation of the third and fourth syndromes S3(x) and S4(x) by the syndrome calculation unit 420 according to the method illustrated in FIG. 7 and described in detail above may be ended and/or completed. Since the KES unit 430 is at a ready state, and the third and fourth syndromes S3(x) and S4(x) have been calculated, the third and fourth syndromes S3(x) and S4(x) may be transferred to the KES unit 430. The KES unit 430 may calculate the third and fourth error location polynomials Λ 3(x) and Λ 4(x) based upon the third and fourth syndromes S3(x) and S4(x) according to the method illustrated in FIG. 8 and described in detail above.

The channels CH0 and CH1 and the syndrome calculation unit 420 may enter into a ready state. The fifth read vector RV5 may be received via the channel CH0, and the sixth read vector RV6 may be received via the channel CH1. The syndrome calculation unit 420 may calculate the fifth and sixth syndromes S5(x) and S6(x) from the fifth and sixth read vectors RV5 and RV6 according to the method illustrated in FIG. 7 and described in detail above.

If error correction of the first read vector RV1 is completed, the first error-corrected data vector CDV1 may be output. At T5, the first error-corrected data vector CDV1 may be output. The second error-corrected data vector CDV2 may be output following the first error-corrected data vector CDV1.

When the number of errors of the first and second read vectors RV1 and RV2 is below the first error number EN1 (e.g., n/4), the number of chien search cycles may be less than that of data input/output cycles. At T6, when cycles less in number than data input/output cycles elapse from T3, chien search on the first and second error location polynomials Λ 1(x) and Λ 2(x) may be ended and/or completed. The chien search unit 440 may enter into a ready state.

At T7, calculation of the third and fourth error location polynomials Λ 3(x) and Λ 4(x) by the KES unit 430, according to the method illustrated in FIG. 8 and described in detail above, may be completed. The chien search unit 440 may perform a chien search operation according to the method illustrated in FIG. 9 and described in detail above, and the KES unit 430 may enter into a ready state.

At T8, inputs of the fifth and sixth read vectors RV5 and RV6 and calculation of the fifth and sixth syndromes S5(x) and S6(x) by the syndrome calculation unit 420, according to the method illustrated in FIG. 7 and described in detail above, may be completed. Calculation of the fifth and sixth error location polynomials Λ 5(x) and Λ 6(x) may be performed by the KES unit 430 according to the method illustrated in FIG. 8 and described in detail above. Inputs of the seventh and eighth read vectors RV7 and RV8 and calculation of the seventh and eighth syndromes S7(x) and S8(x) by the syndrome calculation unit 420 according to the method illustrated in FIG. 7 and described in detail above may be performed.

Figure 17:
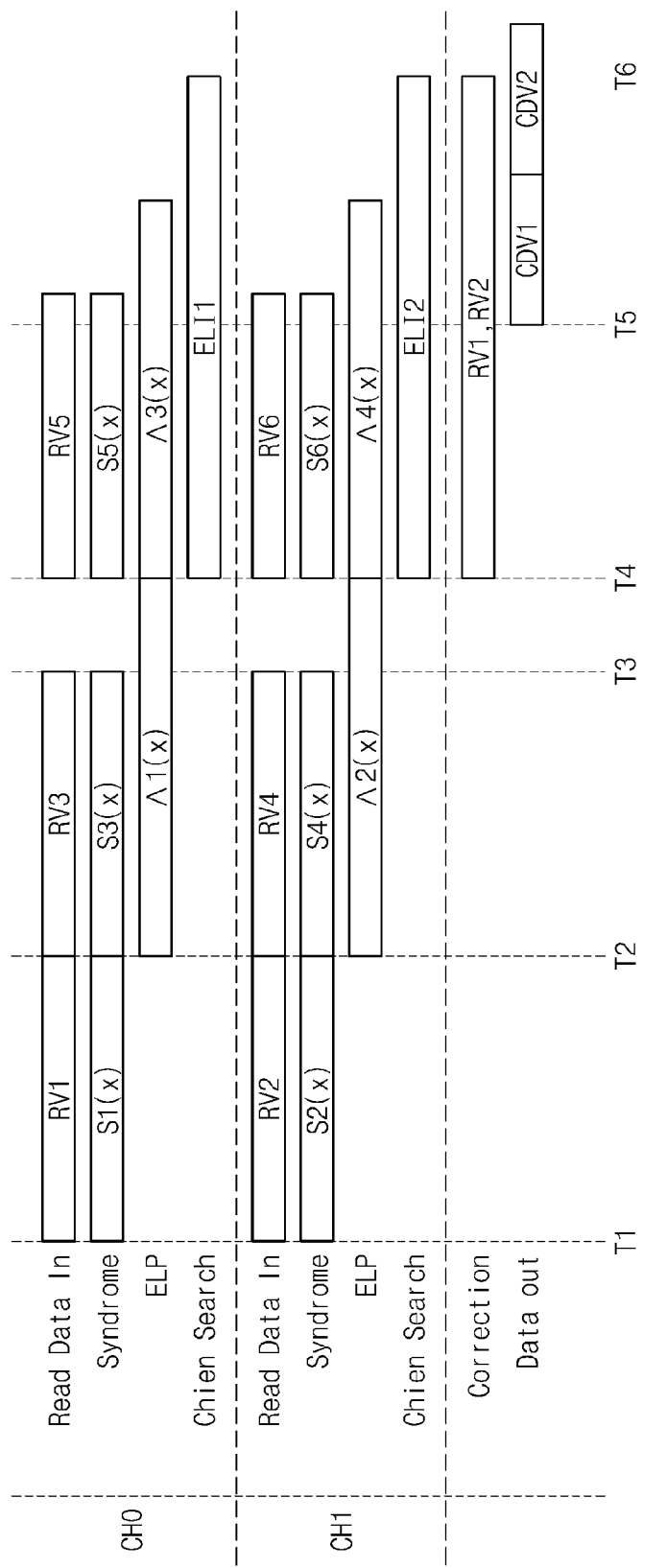
FIG. 17 is a timing diagram illustrating an error correction decoding operation according to exemplary embodiments of the present general inventive concept.

FIG. 17 is a timing diagram illustrating an error correction decoding operation according to exemplary embodiments of the present general inventive concept. In exemplary embodiments, the number of errors of a read vector RV may be over the first error number EN1 (e.g., n/4, where n is the maximum error correction bit number of the ECC decoder 400) and below the second error number EN2 (e.g., n/2). Referring to FIGS. 6 and 17, at T1, the first read vector RV1 may be received from a channel CH0, and the second read vector RV2 may be received from a channel CH1. A syndrome calculation unit 420 may calculate the first and second syndromes S1(x) and S2(x) based upon the first and second read vectors RV1 and RV2 according to the method illustrated in FIG. 7 and described in detail above.

At T2, inputs of the first and second read vectors RV1 and RV2 and calculation of the first and second syndromes S1(x) and S2(x) may be completed. The first and second syndromes S1(x) and S2(x) may be transferred to a KES unit 430. The KES unit 430 may calculate the first and second error location polynomials Λ 1(x) and Λ 2(x) based upon the first and second syndromes S1(x) and S2(x) and according to the method illustrated in FIG. 8 and described in detail above.

The channels CH0 and CH1 and the syndrome calculation unit 420 may enter into a ready state. The third read vector RV3 may be received via the channel CH0, and the fourth read vector RV4 may be received via the channel CH1 at T2. The syndrome calculation unit 420 may calculate the third and fourth syndromes S3(x) and S4(x) based upon the third and fourth read vectors RV3 and RV4 according to the method illustrated in FIG. 7 and described in detail above.

At T3, inputs of the third and fourth read vectors RV3 and RV4 and calculation of the third and fourth syndromes S3(x) and S4(x) may be completed. However, since the KES unit 430 is in a busy state, the syndrome calculation unit 420 may maintain the third and fourth syndromes S3(x) and S4(x). The KES unit 430 is calculating the first and second error location polynomials Λ 1(x) and Λ 2(x) at T3, and thus may not yet receive the calculated third and fourth syndromes S3(x) and S4(x) from the syndrome calculation unit 420. As illustrated in FIG. 17, there may be a delay between the completion of the calculation of the calculated third and fourth syndromes S3(x) and S4(x) at T3 and the calculation of the third and fourth error location polynomials Λ 3(x) and Λ 4(x) at T4.

When the number of errors of the read vector RV is greater than the first error number EN1 (e.g., n/4) and below the second error number EN2 (e.g., n/2), the number of calculation cycles of the error location polynomial Λ (x) may be more than (i.e., greater than) that of data input/output cycles. That is, at T4, when there are more calculation cycles than data input/output cycles from T2, calculation of the first and second error location polynomials Λ 1(x) and Λ 2(x) may be completed. The first and second error location polynomials Λ 1(x) and Λ 2(x) may be sent to a chien search unit 440 to determine error location information ELI1 and ELI2, respectively, for channels CH0 and CH1 at T4.

The chien search unit 440 may execute a chien search based upon the first and second error location polynomials Λ 1(x) and Λ 2(x) received from the key equation solving unit 430. Forward chien search may be performed sequentially from an end of a data portion of a read vector RV (e.g., the read data vector RDV of the read vector RV illustrated in FIGS. 4 and 11). According to the chien search result, an error may be detected and corrected sequentially from an end of a data portion of the read vector RV. That is, error correction may be executed at the chien search at T4.

The KES unit 430 may enter into a ready state at T4 when the calculation of the first and second error location polynomials Λ 1(x) and Λ 2(x) are completed.

The syndrome calculation unit 420 may transfer the third and fourth syndromes S3(x) and S4(x) to the KES unit 430 at T4. The KES unit 430 may calculate the third and fourth error location polynomials Λ 3(x) and Λ 4(x) based upon third and fourth syndromes S3(x) and S4(x) according to the method illustrated in FIG. 8 as described in detail above.

The channels CH0 and CH1 and the syndrome calculation unit 420 may enter into a ready state. The fifth read vector RV5 may be received via the channel CH0, and the sixth read vector RV6 may be received via the channel CH1. The syndrome calculation unit 420 may calculate the fifth and sixth syndromes S5(x) and S6(x) based upon the fifth and sixth read vectors RV5 and RV6 according to the method illustrated in FIG. 7 and described in detail above.

If error correction of the first read vector RV1 is completed by the error correcting unit 450, the first error-corrected data vector CDV1 may be output. At T5, the first error-corrected data vector CDV1 may be output. The second error-corrected data vector CDV2 may be output by the error connecting unit 450 following the first error-corrected data vector CDV1.

When the number of errors of the first and second read vectors RV1 and RV2 is greater than the first error number EN1 (e.g., n/4) and less than the second error number EN2 (e.g., n/2), the number of chien search cycles may be greater than that of data input/output cycles. At T6, when there are more cycles in number than the data input/output cycles have elapsed from T3, a chien search on the first and second error location polynomials Λ 1(x) and Λ 2(x) may be ended and/or completed. The chien search unit 440 may enter into a ready state.

As described above, calculation cycles of an error location polynomial Λ (x) may vary according to the number of errors of a read vector RV. The greater the number of errors in the read vector RV there are, the greater the number of calculation cycles of the error location polynomial Λ (x). Start timing of chien search by the chien search unit 440 may be delayed or moved up by an increase or decrease in calculation cycles of the error location polynomial Λ (x). That is, the greater the number of calculation cycles of the error location polynomial Λ (x), the more the start timing of the chien search by the chien search unit 440 may be delayed. As the number of calculation cycles of the error location polynomial Λ (x) decreases, the start timing of the chien search by the chien search unit 440 may occur at an earlier time, and possibly maintain an on-the-fly operating mode.

Chien search cycles may vary according to the number of errors of the read vector RV. Chien search cycles may increase when the number of errors of the read vector RV is over at least one threshold value. Start timing of error correction may be delayed or moved up by an increase or decrease in the number of chien search cycles. Calculation of the error location polynomial Λ (x) and performing the chien search may form independent decoding stages for the ECC decoder 400, that includes the key equation solving unit 430 and the chien search unit 440.

Figure 18:
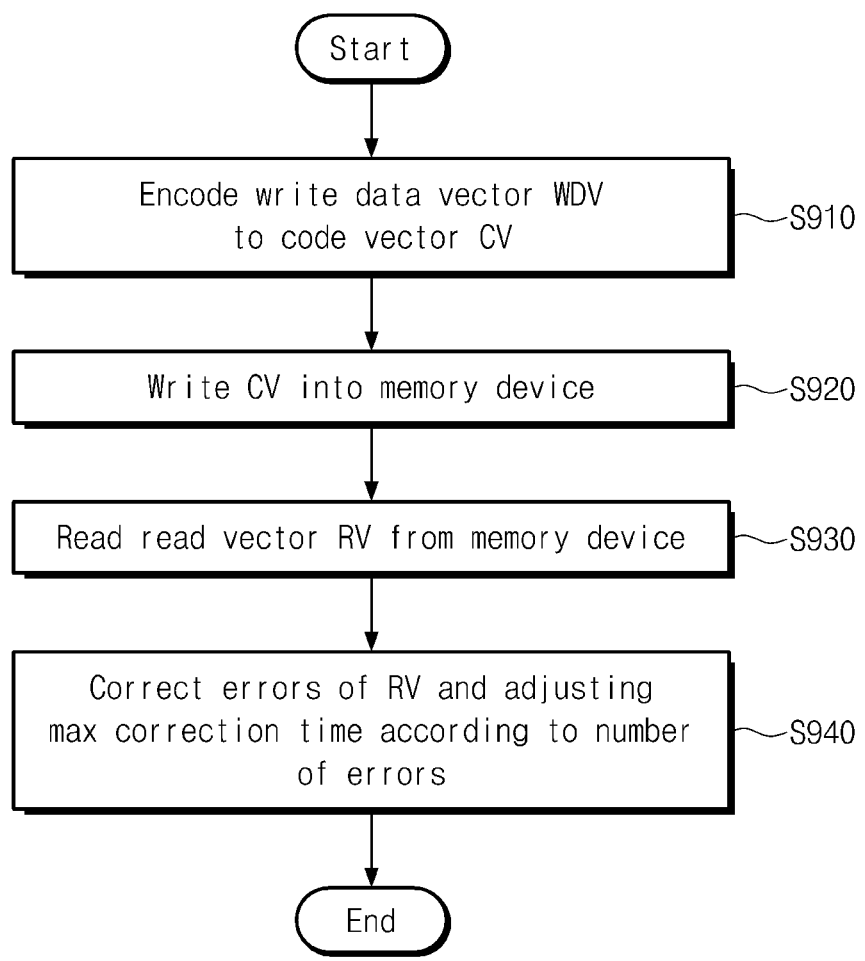
FIG. 18 is a flowchart illustrating an operating method of a controller in FIG. 1 according to exemplary embodiments of the present general inventive concept.

FIG. 18 is a flowchart illustrating an operating method of a controller in FIG. 1 according to exemplary embodiments of the present general inventive concept. Referring to FIGS. 1 and 18, in operation S910, a write data vector WDV may be encoded by the ECC encoder 300 of the controller 200 to form a code vector CV to be output to the memory device 100. In operation S920, the code vector CV may be written in the memory device 100. In operation S930, a read vector RV may be read from the memory device 100. The operations S910 to S930 may be performed in the same manner as operations S110 to S130 illustrated in FIG. 2 and described in detail above.

In operation S940, the maximum correction time may be adjusted according to the number of errors of a read vector RV, and errors of the read vector RV may be corrected. That is, the number of read errors of the read vector RV may be determined, and the maximum correction time allotted to correct the read errors (e.g., with the error correction unit 450) may be adjusted. The maximum correction time to correct the read errors may be increased as the number of read errors increases. As illustrated in Table 7 and described below, the maximum time may be increased according to whether a chien search is performed on the data portions and/or parity portions of the read vector RV, as well as the operation mode of the chien search unit 440 (e.g., full search mode, half search mode, or quarter search mode).

Figure 19:
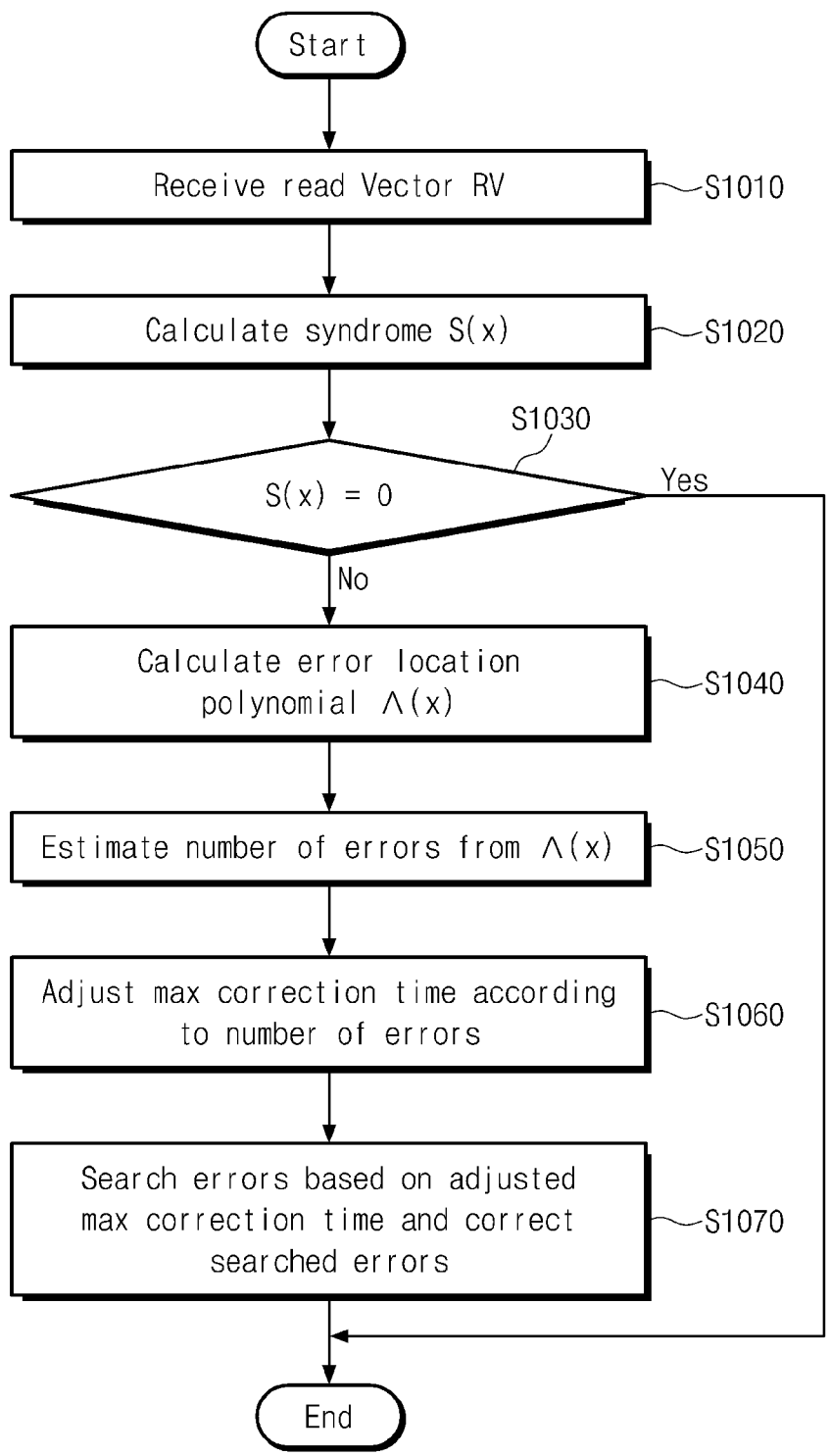
FIG. 19 is a flowchart illustrating an operation in which the maximum error search time is adjusted and a read vector is decoded according to exemplary embodiments of the present general inventive concept.

FIG. 19 is a flowchart illustrating a method of controlling the operation of a memory system in which the maximum error search time is adjusted and a read vector is decoded. Referring to FIGS. 1, 6, and 19, in operation S1010, a read vector RV may be received by the ECC decoder 400 of the controller 200. In operation S1020, a syndrome S(x) of the read vector RV may be calculated by a syndrome calculation unit 420 (e.g., according to the method illustrated in FIG. 7 and described in detail above). In operation S1030, it may be determined whether the syndrome S(x) is '0'. If the syndrome S(x) is '0', error correction may be ended. If the syndrome S(x) is non-zero, an error location polynomial Λ (x) may be calculated by the KES unit 430 by the method illustrated in FIG. 8 and described above according to the syndrome S(x) at operation S1040. In operation S1050, the number of errors of the read vector RV may be calculated according to the error location polynomial Λ (x). The operations S1010 to S1050 may be performed in the same manner as operations S310 to S350, as described above in connection with FIG. 5.

In operation S1060, the maximum error search time may be adjusted according to the calculated error number. That is, the maximum search time may be increased or decreased according to the calculated error number. In exemplary embodiments of the present general inventive concept, the maximum search time may be increased by a predetermined amount if the calculated error number is greater than at least one predetermined threshold value. The maximum search time may be decreased by a predetermined amount when the calculated error number is less than at least one predetermined threshold value. In exemplary embodiments of the present general inventive concept, the maximum time may be increased according to whether the chien search is performed on the data portions and/or parity portions of the read vector RV, as well as the operation mode of the chien search unit 440 (e.g., full search mode, half search mode, quarter search mode). In operation S1070, error detection may be made according to the adjusted maximum error search time, and detected errors may be corrected by the error correction unit 450.

Calculation of a syndrome S(x), calculation of an error location polynomial Λ (x), and a chien search may be performed in the same manner as illustrated in FIGS. 7 to 14 and described in detail above.

As described with reference to FIGS. 15 to 17, a syndrome calculation time may not affect a variation of an error decoding time. As described above in connection with FIGS. 15 to 17, when the syndrome is completed may determine when an error decoding may begin. That is, the error decoding may be delayed according to when the calculation of the syndrome is completed, but it may not vary (i.e., increase or decrease) the time to compete the error decoding.

When the number of errors of a read vector RV is below the first error number EN1 (e.g., n/4, where n is the maximum error correction bit number of the ECC decoder 400), the maximum calculation time of an error location polynomial Λ (x) may be the first solving time ST1. The first solving time ST1 may correspond to a calculation time (or, cycles) of the error location polynomial Λ (x) when the number of errors of a read vector RV is the first error number EN1 (e.g., n/4). When the number of errors of a read vector RV is over the first error number EN1 (e.g., n/4) and below the second error number EN2 (e.g., n/2), the maximum calculation time of the error location polynomial Λ (x) may be the second solving time ST2. The second solving time ST2 may correspond to a calculation time (or, cycles) of the error location polynomial Λ (x) when the number of errors of the read vector RV is the second error number EN2 (e.g., n/2). When the number of errors of the read vector RV is below n, the maximum calculation time of the error location polynomial Λ (x) may be the third solving time ST3. The third solving time ST3 may correspond to a calculation time (or, cycles) of the error location polynomial Λ (x) when the number of errors of the read vector RV is n.

When the number of errors of the read vector RV is below the first error number EN1 (e.g., n/4), a chien search may be performed by the chien search unit 440 operating in a full operation mode. A chien search time may be the first total time TT1 or the first data time DT1. The first total time TT1 may be a chien search time when chien search on data and parity portions of the read vector RV is executed. The first data time DT1 may be a chien search time when chien search on a parity portion of the read vector RV may be skipped.

When the number of errors of the read vector RV is greater than the first error number EN1 (e.g., n/4) and less than the second error number EN2 (e.g., n/2), a chien search may be performed by the chien search unit 440 operating in a half operation mode. A chien search time may be the second total time TT2 or the second data time DT2. The second total time TT2 may be a chien search time when chien search on data and parity portions of the read vector RV is executed. The second data time DT2 may be a chien search time when chien search on a parity portion of the read vector RV may be skipped.

When the number of errors of the read vector RV is greater than the second error number EN2 (e.g., n/2) and below the second threshold value TV2, a chien search may be performed with the chien search unit 440 operating in a quarter operation mode. A chien search time may be the third total time TT3 or the third data time DT3. The third total time TT3 may be a chien search time when the chien search on the data and parity portions of the read vector RV (e.g., the read data vector RDV and the read parity vector RPV) is executed. The third data time DT3 may be a chien search time when a chien search on the parity portion of the read vector RV may be skipped.

When the number of errors of the read vector RV is greater than the second threshold value TV2 and below n (i.e., where n is the maximum error correction bit number of the ECC decoder 400), a chien search may be performed by the chien search unit 440 operating in a quarter operation mode. A chien search time may be the third total time TT3.

Error correction may be performed by an error correcting unit (e.g., error correcting unit 450 of the ECC decoder 400) when the error locations are identified by a chien search. Accordingly, error correction may not affect a variation of an error decoding time. That is, the error decoding may be delayed according to when, for example, a calculation of a syndrome S(x) and/or a calculation of an error location polynomial Λ (x) is completed, but it may not vary (i.e., increase or decrease) the time to compete the error correction.

A time affecting a variation of an error correction time may be a calculation time of an error location polynomial Λ (x) and a chien search time. Calculation of the error location polynomial Λ (x) and chien search may have the maximum time adjusted according to the number of errors of the read vector RV. For example, as the number of errors increases, the maximum adjustment time may be increased. The maximum times of key equation solving (KES) and chien search (CS) may be illustrated in the following table 7.

TABLE 7

| EN | EN < n/4 | n/4 < EN < n/2 | n/2 < EN < TV2 | TV2 < EN < n |
|---|---|---|---|---|
| Max KES time | ST1 | ST2 | ST3 | ST3 |
| Max CS time | TT1 or DT1 | TT2 or DT2 | TT3 or DT3 | TT3 |
| Max time | (ST1 + TT1) or (ST1 + DT1) | (ST2 + TT2) or (ST2 + DT2) | (ST3 + TT3) or (ST3 + DT3) | ST3 + TT3 |

That is, the maximum error time may be adjusted according to the number of errors (EN) of the read vector RV. As illustrated in Table 7, the maximum time may be increased according to whether the chien search is performed on the data portions and/or parity portions of the read vector RV, as well as the operation mode of the chien search unit 440 (e.g., full search mode, half search mode, quarter search mode).

Figure 20:
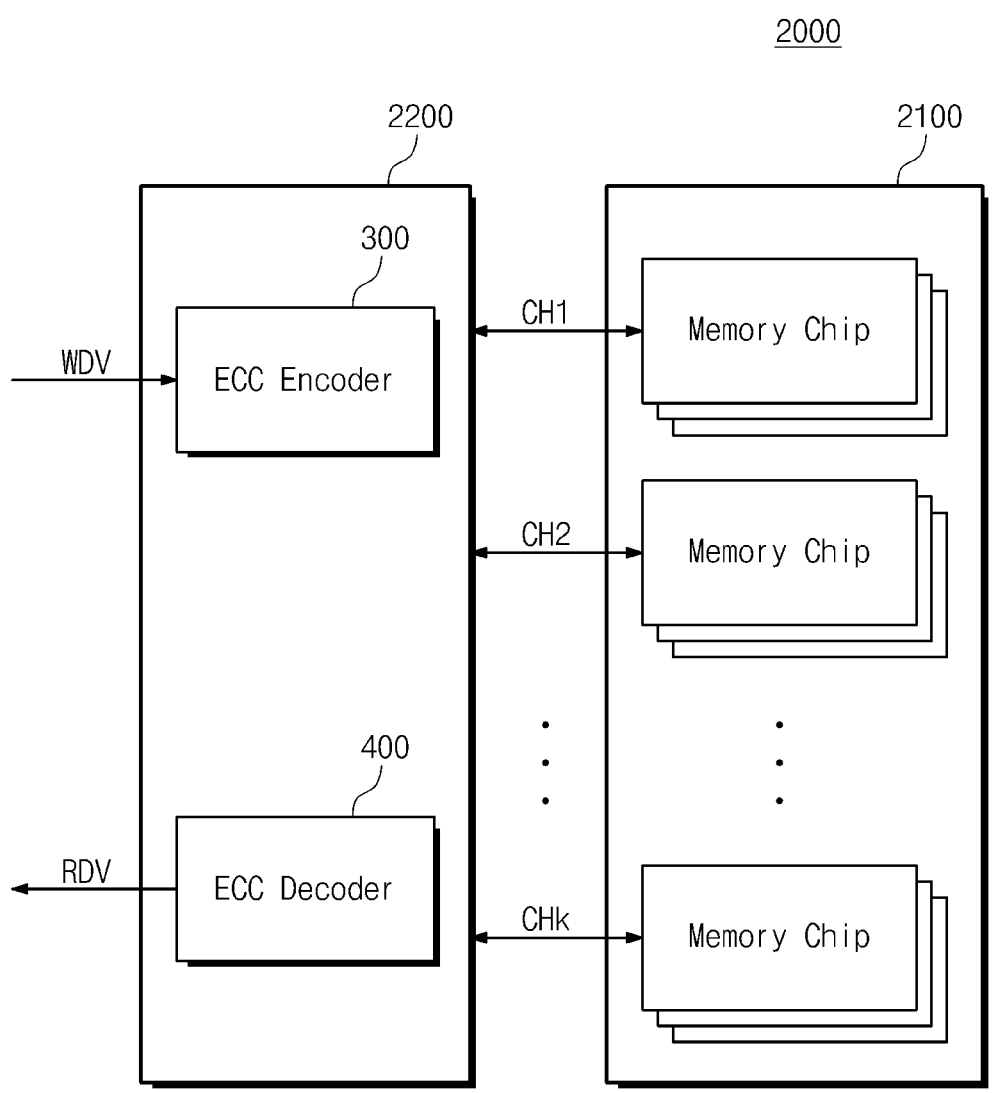
FIG. 20 is a block diagram illustrating an application of a memory system in FIG. 1 according to exemplary embodiments of the present general inventive concept.

FIG. 20 is a block diagram illustrating an application of a memory system in FIG. 1. Referring to FIG. 20, a memory system 2000 may include a memory device 2100 and a controller 2200. The memory device 2100 may include a plurality of memory chips, which may be divided into a plurality of groups. Memory chips in each group may communicate with the controller 2200 via a common channel. In exemplary embodiments of the present general inventive concept, the memory chips communicating with the controller 2200 via channels CH1 to CHk are exemplarily illustrated in FIG. 20. Memory modules can be connected with the channels instead of the memory chips.

The controller 2200 may include an ECC encoder 300 and an ECC decoder 400. The ECC encoder 300 and the ECC decoder 400 may operate the same as described above with reference to FIGS. 2 to 19. For example, the ECC decoder 400 may adjust cycle-per-power consumption and/or the maximum correction time according to the number of errors of a read vector RV and to make an error correction.

FIG. 20 illustrates that a plurality of memory chips may be communicatively connected with one channel. However, in exemplary embodiments of the present general inventive concept, the memory system 2000 may have one channel that is connected with one memory chip.

Figure 21:
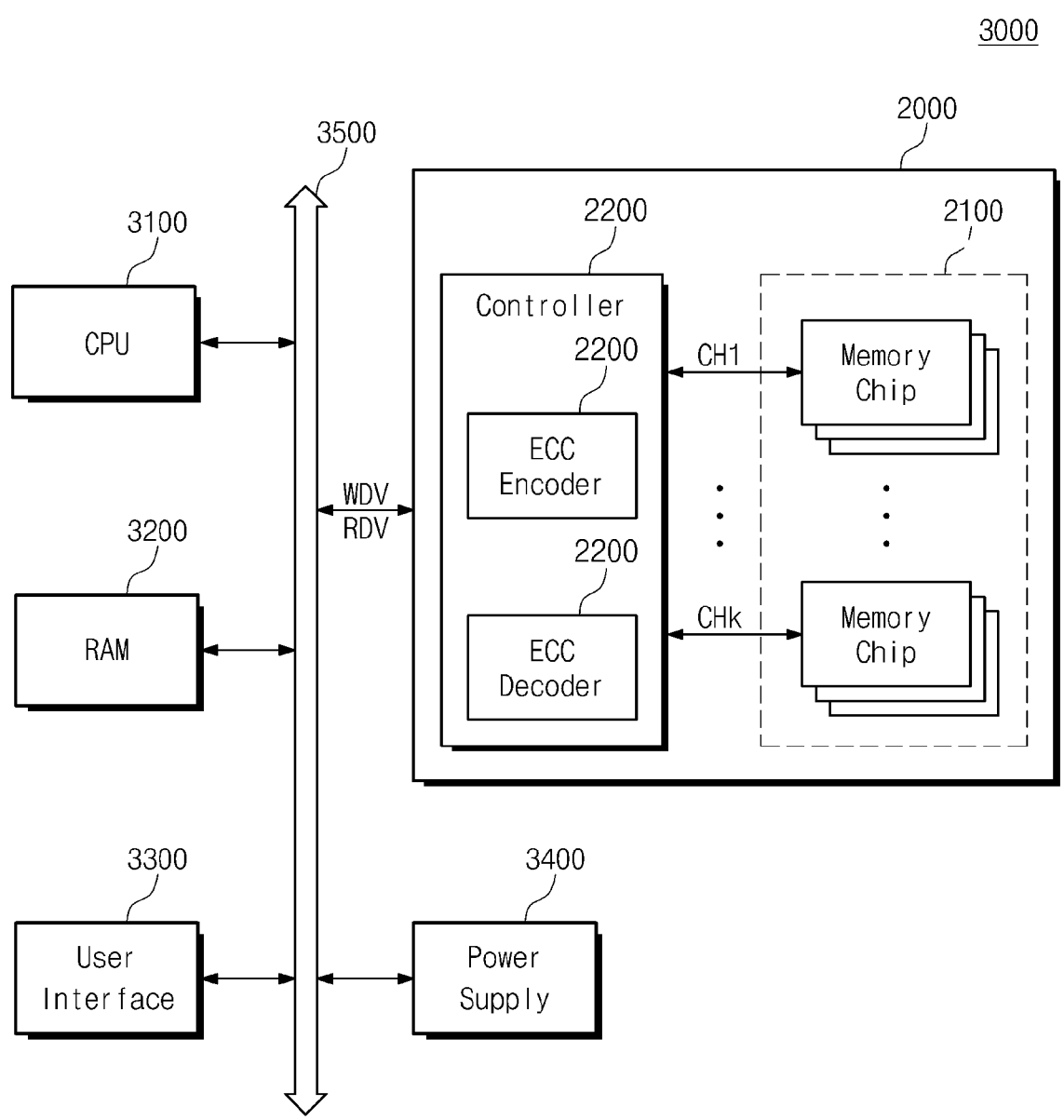
FIG. 21 is a block diagram illustrating a computing system including a memory system in FIG. 20 according to exemplary embodiments of the present general inventive concept.

FIG. 21 is a block diagram illustrating a computing system including a memory system in FIG. 20 according to exemplary embodiments of the present general inventive concept. Referring to FIG. 21, a computing system 3000 may include a CPU 3100, a RAM 3200, a user interface 3300, a power supply 3400, and a memory system 2000. The memory system 2000 may include a memory device 2100 and controller 2200. The memory device 2000 may be similar to the memory device 100 discussed above in connection with FIGS. 1-19 and/or the memory device 2100 discussed above in connection with FIG. 21.

The CPU 3100 may be a central processing unit and/or any suitable controller, processor, filed programmable gate array, programmable logic device, or integrated circuit to control the operation of memory system 2000 and/or the computing system 300 according to exemplary embodiments of the present general inventive concept as disclosed herein. The RAM 3200 may be a Random Access Memory (RAM), a static random access memory (SRAM), a dynamic RAM (DRAM), a synchronous DRAM (SDRAM), and the like. The user interface 3300 may include a keyboard, a display, a touch screen, a mouse, a trackpad, and/or any other suitable device to receive input from a user. The power supply 3400 may supply electrical power to the computing system 3000 so that it may operate.

The memory system 2000 may be electrically connected with the elements 3100 to 3400 via a system bus 3500. Data provided via the user interface 3300 or processed by the CPU 3100 may be stored in the memory system 2000.

FIG. 21 illustrates that the memory device 2100 is connected with the system bus 3500 via a controller 2200. In exemplary embodiments of the present general inventive concept, the memory device 2100 can be directly connected to the system bus 3500.

The memory system 2000 in FIG. 21 may correspond to a memory system described in FIG. 20. However, the memory system 2000 can be replaced with a memory system 1000 as illustrated in FIG. 1 and described in detail above.

In exemplary embodiments of the present general inventive concept, the computing system 3000 may include memory systems 1000 and 2000 described with reference to FIGS. 1 and 21.

Exemplary embodiments of the present general inventive concept may measure and/or estimate the number of errors of a read vector, and may adjust power consumption of an ECC decoder according to the measured error number.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

Although several embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A controller of a memory system to control a memory device, comprising:
a key equation solving unit to calculate an error location polynomial in a read vector received by the controller to read data from the memory device;
a control unit to estimate the number of errors in the received read vector according to at least one of the calculated error location polynomial and information on the error location polynomial; and
a chien search unit to search error locations of the received read vector according to the calculated error location polynomial,
wherein the control unit adjusts the cycle-per power consumption of the chien search unit.

2. The controller of claim 1, further comprising:
an error correcting unit to correct errors of the received read vector at the error locations determined by the chien search unit using the error location polynomial calculated by the key equation solving unit.

3. The controller of claim 1, wherein the control unit adjusts the cycle-per power consumption of the chien search unit by adjusting the number of bits to be searched at the same time in the received read vector according to the number of errors.

4. The controller of claim 3, wherein the control unit controls the chien search unit to operate in a full search mode to simultaneously search the bits of at least a data portion of the received read vector when the number of errors is less than or equal to a predetermined first error number.

5. The controller of claim 4, wherein the control unit controls the chien search unit to operate in a half search mode to simultaneously search half of the number of bits of the received read vector as a full search mode at the same time when the number of errors is greater than the predetermined first error number and less than a predetermined second error number.

6. The controller of claim 5, wherein the cycle-per-power consumption of the chien search unit operating in the half search mode is less than that of the full search mode.

7. The controller of claim 5, wherein the control unit controls the chien search unit to operate in a quarter search mode to simultaneously search one quarter of the number of bits of the received read vector at the same time as the full search mode when the number of errors is greater than the predetermined second error number.

8. The controller of claim 7, wherein the cycle-per-power consumption of the chien search unit operating in the quarter search mode is less than that of the half search mode.

9. The controller of claim 1, wherein the control unit controls the chien search unit to perform a chien search on only a data portion of the received read vector when the number of errors is less than or equal to a predetermined threshold value.

10. The controller of claim 1, wherein the control unit controls the chien search unit to perform a chien search on a data portion and a parity portion of the received read vector when the number of detected errors is greater than a predetermined threshold value.

11. The controller of claim 1, wherein the control unit adjusts a maximum correction time of the chien search unit according to the number of errors of the read vector.

12. The controller of claim 11, wherein the control unit adjusts the maximum correction time of the chien search unit to a first predetermined solving time when the number of errors is less than a first predetermined error number.

13. The controller of claim 12, wherein when the number of errors is less than the first predetermined error number, the control unit controls the chien search unit to operate in a full search mode to simultaneously search the bits of at least a data portion of the read vector.

14. The controller of claim 12, wherein when the number of errors is greater than the first predetermined error number and less than a second predetermined error number, the control unit controls the chien search unit to operate in a half search mode to simultaneously search half the number of the bits of at least a data portion of the read vector as when operating in a full search mode.

15. The controller of claim 14, wherein when the number of errors is greater than a second predetermined error number, the control unit controls the chien search unit to operate in a quarter search mode to simultaneously search one quarter the number of the bits of at least a data portion of the read vector as when operating in a full search mode.

16. The controller of claim 11, wherein the control unit adjusts the maximum correction time of the chien search unit to perform the chien search on a data portion and a parity portion of the received read vector when the number of detected errors is greater than a predetermined threshold value.

17. A method of controlling a memory system including a memory device, the method comprising:
calculating an error location polynomial in a received read vector with a key equation solving unit of the memory system to read data from the memory device;
estimating the number of errors in the received read vector with a control unit of the memory system according to at least one of the calculated error location polynomial and information on the error location polynomial; and
searching error locations of the received read vector according to the calculated error location polynomial with a chien search unit of the memory system with the control unit; and
adjusting the cycle-per power consumption of the chien search unit with the control unit.

18. The method of claim 17, further comprising:
correcting errors of the received read vector with an error correcting unit at the error locations determined by the chien search unit using the error location polynomial calculated by the key equation solving unit.

19. The method of claim 17, wherein the adjusting the cycle-per power consumption of the chien search unit comprises:
adjusting the number of bits to be searched at the same time in the received read vector with the control unit according to the number of errors.

20. The method of claim 19, further comprising:
operating the chien search unit in a full search mode to simultaneously search the bits of at least a data portion of the received read vector when the number of errors is less than or equal to a predetermined first error number.

21. The method of claim 20, further comprising:
operating the chien search unit in a half search mode to simultaneously search half of the number of bits of the received read vector as a full search mode at the same time when the number of errors is greater than the predetermined first error number and less than a predetermined second error number.

22. The method of claim 21, wherein the cycle-per-power consumption of the chien search unit operating in the half search mode is less than that of the full search mode.

23. The method of claim 21, further comprising:
operating the chien search unit in a quarter search mode to simultaneously search one quarter of the number of bits of the received read vector at the same time as the full search mode when the number of errors is greater than the predetermined second error number.

24. The method of claim 23, wherein the cycle-per-power consumption of the chien search unit operating in the quarter search mode is less than that of the half search mode.

25. The method of claim 17, further comprising:
controlling the chien search unit with the control unit to perform a chien search on only a data portion of the received read vector when the number of errors is less than or equal to a predetermined threshold value.

26. The method of claim 17, further comprising:
controlling the chien search unit with the control unit to perform a chien search on a data portion and a parity portion of the received read vector when the number of detected errors is greater than a predetermined threshold value.

27. The method of claim 17, further comprising:
adjusting a maximum correction time of the chien search unit with the control unit according to the number of errors of the read vector.

28. The method of claim 27, further comprising:
adjusting the maximum correction time of the chien search unit with the control unit to a first predetermined solving time when the number of errors is less than a first predetermined error number.

29. The method of claim 28, further comprising:
when the number of errors is less than the first predetermined error number, operating the chien search unit in a full search mode to simultaneously search the bits of at least a data portion of the read vector.

30. The method of claim 28, further comprising:
when the number of errors is greater than the first predetermined error number and less than a second predetermined error number, operating the chien search unit in a half search mode to simultaneously search half the number of the bits of at least a data portion of the read vector as when operating in a full search mode.

31. The method of claim 30, further comprising
when the number of errors is greater than a second predetermined error number, operating the chien search unit in a quarter search mode to simultaneously search one quarter the number of the bits of at least a data portion of the read vector as when operating in a full search mode.

32. The method of claim 27, further comprising:
adjusting the maximum correction time of the chien search unit with the control unit to perform the chien search on a data portion and a parity portion of the received read vector when the number of detected errors is greater than a predetermined threshold value.

33. A method of controlling a memory system having a controller coupled via at least one channel to at least one memory device, the method comprising:
determining an estimated number of errors and error location information of a read vector received by the controller to read data from the at least one memory device via the at least one channel; and
adjusting at least one of a cycle-per-power consumption and a maximum correction time of a chien search unit of the memory system that searches error locations of the read vector according to the estimated number of errors and the determined error location information.

34. A controller of a memory system having at least one memory device coupled to the controller via at least one channel, comprising:
an error correction code decoder of the controller to determine an estimated number of errors and error location information of a read vector received by the controller to read data from the at least one memory device via the at least one channel; and
a control unit of the error correction code decoder to adjust at least one of a cycle-per-power consumption and a maximum correction time of a chien search unit of the memory system that searches error locations of the read vector according to the estimated number of errors and the determined error location information.

* * * * *